(12) United States Patent
Shin et al.

(10) Patent No.: US 9,819,361 B2
(45) Date of Patent: Nov. 14, 2017

(54) LIST DECODING METHOD FOR POLAR CODE AND MEMORY SYSTEM USING THE SAME

(71) Applicant: Samsung Electronics Co., Ltd., Suwon-si, Gyeonggi-do (KR)

(72) Inventors: Dong-Min Shin, Seoul (KR); Jun-jin Kong, Yongin-si (KR); Ki-Jun Lee, Seoul (KR); Myung-Kyu Lee, Seoul (KR); Kyeong-Cheol Yang, Pohang-si (KR); Seung-Chan Lim, Pohang-si (KR)

(73) Assignees: SAMSUNG ELECTRONICS CO., LTD., Gyeonggi-Do (KR); POSTECH ACADEMY-INDUSTRY FOUNDATION, Gyeongsangbuk-Do (KR)

( * ) Notice: Subject to any disclaimer, the term of this patent is extended or adjusted under 35 U.S.C. 154(b) by 12 days.

(21) Appl. No.: 14/645,073

(22) Filed: Mar. 11, 2015

(65) Prior Publication Data

US 2015/0263767 A1 Sep. 17, 2015

(30) Foreign Application Priority Data

Mar. 11, 2014 (KR) ........................ 10-2014-0028598

(51) Int. Cl.
*H03M 13/00* (2006.01)
*H03M 13/13* (2006.01)

(52) U.S. Cl.
CPC ......... *H03M 13/13* (2013.01); *H03M 13/134* (2013.01)

(58) Field of Classification Search
CPC .............................. H03M 13/13; H03M 13/45
See application file for complete search history.

(56) References Cited

U.S. PATENT DOCUMENTS

| 6,105,158 | A | * | 8/2000 | Chen | ..................... | H03M 13/09 |
| | | | | | | 714/755 |
| 6,507,927 | B1 | * | 1/2003 | Kalliojarvi | ........ | H03M 13/4146 |
| | | | | | | 714/795 |
| 7,458,003 | B2 | | 11/2008 | Pfister | | |

(Continued)

OTHER PUBLICATIONS

Ido Tal et al., "List Decoding of Polar Codes", IEEE International Symposium on Information Theory Proceedings, 2011, pp. 1-5.

(Continued)

*Primary Examiner* — M. Mujtaba Chaudry
(74) *Attorney, Agent, or Firm* — Harness, Dickey & Pierce, P.L.C.

(57) ABSTRACT

A list decoding method for a polar code includes generating a tree-type decoding graph for input codeword symbols; the generating a tree-type decoding graph including, generating a decoding path list to which a decoding edge is added based on a reliability of a decoding path, the decoding path list being generated such that, among decoding paths generated based on the decoding edge, decoding paths within a threshold number of critical paths survive within the decoding path list in an order of high likelihood probability, and determining an estimation value, which corresponds to a decoding path having a maximum likelihood probability from among decoding paths of the decoding path list, as an information word.

17 Claims, 12 Drawing Sheets

(56) References Cited

U.S. PATENT DOCUMENTS

| | | |
|---|---|---|
| 8,347,186 B1 | 1/2013 | Arikan |
| 8,385,117 B2 | 2/2013 | Sakurada et al. |
| 8,473,738 B2 | 6/2013 | Osmolovsky |
| 8,677,227 B2* | 3/2014 | Gross ................. H03M 13/1117 714/807 |
| 2005/0091568 A1* | 4/2005 | Levy ................. H03M 13/2948 714/755 |
| 2011/0044399 A1* | 2/2011 | Dowling ........... H04L 25/03286 375/286 |
| 2012/0054576 A1* | 3/2012 | Gross ................. H03M 13/1117 714/752 |
| 2012/0297273 A1 | 11/2012 | Sakaue et al. |
| 2012/0317460 A1 | 12/2012 | Chilappagari et al. |
| 2013/0077400 A1 | 3/2013 | Sakurada |
| 2013/0117344 A1* | 5/2013 | Gross ...................... G06F 17/10 708/490 |
| 2013/0163330 A1 | 6/2013 | Sharon |
| 2013/0176780 A1 | 7/2013 | Alhussien et al. |
| 2014/0019820 A1* | 1/2014 | Vardy ................... H03M 13/13 714/752 |
| 2015/0229337 A1* | 8/2015 | Alhussien ............. H03M 13/35 714/773 |

OTHER PUBLICATIONS

Erdal Arikan, "Channel polarization: A method for constructing capacity-achieving codes for symmetric binary-input memoryless channels", IEEE, Jul. 20, 2009, pp. 1-21.

* cited by examiner

U1 U2 U3 U4 U5 U6 U7 U8
(FROZEN BIT)   (FROZEN BIT)

U1 U2 U3 U4 U5 U6 U7 U8
(FROZEN BIT)   (FROZEN BIT)

LIST DECODING METHOD FOR POLAR CODE AND MEMORY SYSTEM USING THE SAME

CROSS-REFERENCE TO RELATED APPLICATIONS

This application claims the benefit of Korean Patent Application No. 10-2014-0028598, filed on Mar. 11, 2014, in the Korean Intellectual Property Office, the disclosure of which is incorporated herein in its entirety by reference.

BACKGROUND

One or more example embodiments of the inventive concepts relate to a decoding method and a decoding apparatus, and more particularly, to a list decoding method for a polar code and a memory system using the list decoding method.

In a memory system, an encoding process and a decoding process are performed by using a low density parity check (LDPC) code or a Turbo code. Recently, a polar code, as well as the LDPC code and the Turbo code, has received attention. Accordingly, efficient decoding algorithms for reducing complexity have been actively studied to accomplish a polar code that has excellent performance.

SUMMARY

One or more example embodiments of the inventive concepts provide a list decoding method for a polar code by which the complexity of a decoding process is reduced.

One or more example embodiments of the inventive concepts also provide a memory system for reducing the complexity of a decoding process.

According to one or more example embodiments of the inventive concepts, a list decoding method for a polar code includes generating a tree-type decoding graph for input codeword symbols, the generating a tree-type decoding graph including, generating a decoding path list to which a decoding edge is added based on a reliability of a decoding path, the decoding path list being generated such that, among decoding paths generated based on the decoding edge, decoding paths within a threshold number of critical paths survive within the decoding path list in an order of high likelihood probability; and determining an estimation value, which corresponds to a decoding path having a maximum likelihood probability from among decoding paths of the decoding path list, as an information word.

The list decoding method may further include determining the reliabilities of the generated decoding paths based on log-likelihood ratios for the input codeword symbols.

The determining the reliabilities may include determining, for each of the generated decoding paths, the reliability of the decoding path based on a log-likelihood ratio of a symbol corresponding to each of bit values estimated for a symbol having a maximum value of transition probabilities of a polarization channel, wherein the transition probabilities are calculated in the process of generating the tree-type decoding graph.

The input codeword symbols may include symbols encoded with a non-binary polar code.

The generating a decoding path list may include adding a decoding edge having a reliability that is equal to or higher than a threshold reliability to the decoding path list; and removing decoding paths from the decoding path list in an order of low likelihood possibility such that a total number of decoding paths in the decoding path list is equal to the threshold number of critical paths, in the case that a total number of decoding paths generated based on the decoding edge exceeds the threshold number of critical paths.

The generating a decoding path list may include generating the decoding path list such that a decoding edge having a reliability that is less than the threshold reliability is not added to the decoding path list in the operation of generating the tree-type decoding graph for codeword symbols.

The generating a decoding path list may include adding a decoding edge corresponding to a value of the frozen bit to the decoding path list, when a decoding symbol is the frozen bit; adding a decoding edge having a reliability that is equal to or higher than a threshold reliability to the decoding path list from among decoding edges corresponding to bit values that are capable of being estimated, when the decoding symbol is an information bit; and removing decoding paths from the decoding path list in an order of low likelihood possibility such that the number of decoding paths is equal to the threshold number of critical paths, when the number of decoding paths generated based on the decoding edge exceeds the number of critical paths.

The generating a decoding path list may include generating the decoding path list such that a decoding edge having a low reliability that is less than the threshold reliability is not added to the decoding path list from among decoding edges corresponding to bit values that are capable of being estimated, when the decoding symbol is the information bit.

The generating of the decoding path list may include initializing list size information; adding a decoding edge corresponding to a value of the frozen bit to the decoding path list without changing the list size information, when a decoding symbol is the frozen bit; estimating an information bit without changing the list size information and separating the first decoding path from a current decoding path when the decoding symbol is an information bit and the decoding path has a reliability that is equal to or higher than a threshold reliability; adding a decoding edge, which corresponds to each of bit values that capable of being estimated to separate the first decoding path from the current decoding path, to the decoding path list and adding the number of separated decoding paths to the list size information, when the decoding symbol is the information bit and the decoding path has a reliability that is less than the threshold reliability; and removing decoding paths in an order of likelihood probability from among decoding paths included in the decoding path list by the number of exceeded paths, when the list size information exceeds the number of critical paths.

The determining an estimation value may include selecting a decoding path having a highest likelihood probability from among decoding paths included in the decoding path list after completing the operation of generating the tree-type decoding graph for the input codeword symbols; and determining an estimation value corresponding to the selected decoding path as the information word.

According to one more example embodiments of the inventive concepts, a memory system includes a log likelihood ratio (LLR) calculator that calculates log-likelihood ratios from codeword symbols received from a memory device; a decoding path list generator that generates a decoding path list to which a decoding edge is selectively added in the process of generating a tree-type decoding graph for codeword symbols based on the calculated log-likelihood ratios and in which among decoding paths generated based on the decoding edge, decoding paths within a range of the number of critical paths survive in an order of high likelihood probability; and a decoding path determination unit that calculates likelihood probabilities of decoding paths included in the generated decoding path list and outputs an estimation value, which corresponds to a decoding path having a maximum likelihood probability of the calculated likelihood probabilities, as an information word.

The decoding path list generator may determine the reliability of decoding paths based on a log-likelihood ratio of a symbol corresponding to each of bit values that can be estimated for a symbol having a maximum value of transition probabilities of a polarization channel, which are calculated in the process of generating the tree-type decoding graph.

The decoding path list generator may add a decoding edge having a reliability that is equal to or higher than a threshold reliability to the decoding path list in the process of generating the tree-type decoding graph for codeword symbols based on the calculated log-likelihood ratios and removes decoding paths from the decoding path list in an order of low likelihood possibility so that the number of decoding paths is equal to the number of critical paths in the case that the number of decoding paths generated based on the decoding edge exceeds the number of critical paths.

The memory system may further include an encoder including an input vector generator that combines an input information word with a frozen bit to thereby generate an input symbol vector; and a code vector generator that generates codeword symbols by using the input vector and a generation matrix, wherein the generated codeword symbols are stored in the memory device.

The code vector generator may generate non-binary codeword symbols.

According to one or more example embodiments of the inventive concepts, a list decoding method for a polar code includes generating a tree-type decoding graph for an input codeword by generating a plurality of decoding paths; adding one or more of the generated plurality of decoding paths to a decoding path list based on reliabilities of the generated plurality of decoding paths, the decoding path list having a list size threshold; and when a size of the decoding path list exceeds the list size threshold, reducing the size of the decoding path list to the list size threshold by removing a first reliability path set from the decoding path list, the first reliability path set being one or more reliability paths, from among the generated plurality of reliability paths, having lowest reliabilities; and determining, as an information word, an estimation value based a selected decoding path, the selected decoding path being one of one or more reliability paths remaining in the decoding path list after the reducing.

The determining may include determining the estimation value based on the decoding path having a highest likelihood probability from among the one or more reliability paths remaining in the decoding path list after the reducing.

BRIEF DESCRIPTION OF THE DRAWINGS

The above and other features and advantages of example embodiments of the inventive concepts will become more apparent by describing in detail example embodiments of the inventive concepts with reference to the attached drawings. The accompanying drawings are intended to depict example embodiments of the inventive concepts and should not be interpreted to limit the intended scope of the claims. The accompanying drawings are not to be considered as drawn to scale unless explicitly noted.

DETAILED DESCRIPTION OF THE EMBODIMENTS

Figure 1:
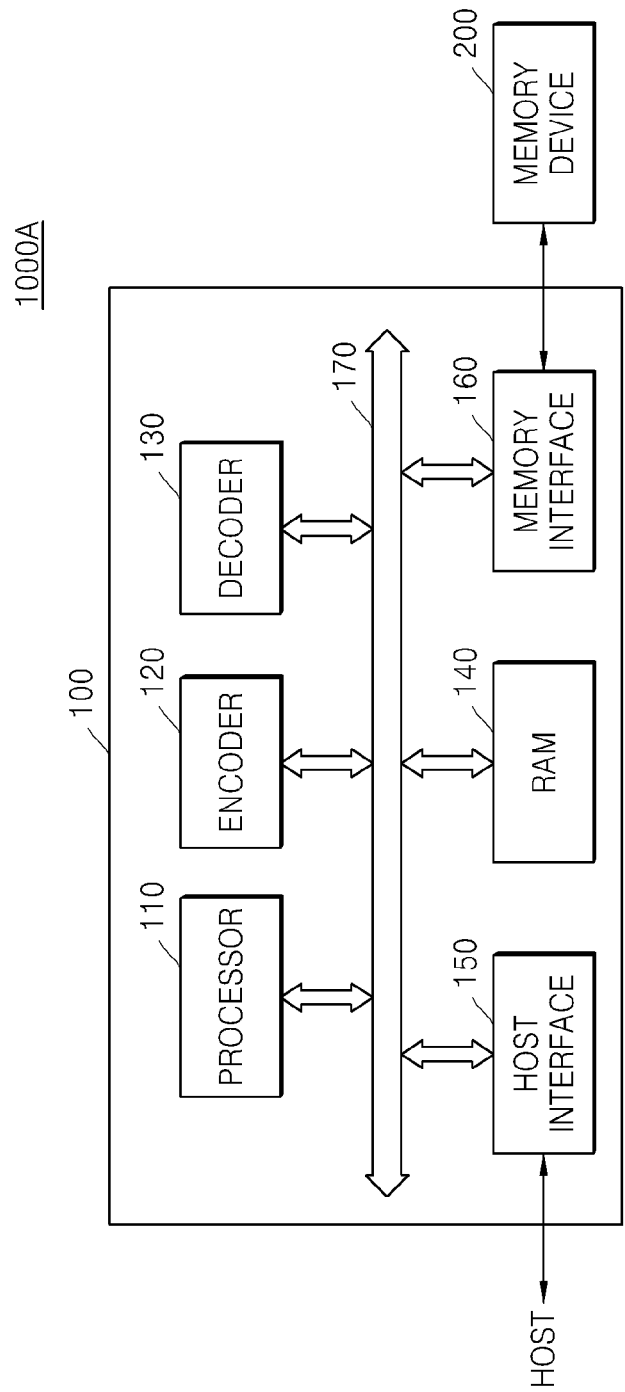
FIG. 1 is a block diagram of a memory system according to at least one example embodiment of the inventive concepts.

Detailed example embodiments of the inventive concepts are disclosed herein. However, specific structural and functional details disclosed herein are merely representative for purposes of describing example embodiments of the inventive concepts. Example embodiments of the inventive concepts may, however, be embodied in many alternate forms and should not be construed as limited to only the embodiments set forth herein.

Accordingly, while example embodiments of the inventive concepts are capable of various modifications and alternative forms, embodiments thereof are shown by way of example in the drawings and will herein be described in detail. It should be understood, however, that there is no intent to limit example embodiments of the inventive concepts to the particular forms disclosed, but to the contrary, example embodiments of the inventive concepts are to cover all modifications, equivalents, and alternatives falling within the scope of example embodiments of the inventive concepts. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the inventive concepts. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the inventive concepts. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Example embodiments of the inventive concepts are described herein with reference to schematic illustrations of idealized embodiments (and intermediate structures) of the inventive concepts. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing.

A polar code that is applied to at least one example embodiment of the inventive concepts is described below.

The polar code receives attention because it provides a design of code and efficient encoding and decoding algorithms while achieving a channel capacity of a discrete memoryless channel by using a successive cancellation decoding method.

The discrete memoryless channel is converted into a set of channels having different reliabilities through a channel polarization process. If data is transmitted only via channels having a high reliability, the reliability of an entire system may be improved.

Channel polarization is a process of generating a set $\{W_N^{(i)}:1\leq i\leq N\}$ of N channels having different reliabilities by using a given discrete memoryless channel W.

When N polarization channels having different reliabilities are generated through channel polarization, a polar codeword is configured to transmit frozen bits having fixed values via channels having low reliability and transmit information bits only via channels having a high reliability.

Examples of a method of decoding a polar code include a successive cancellation decoding method and a list successive cancellation decoding method. The list successive cancellation decoding method is referred to as a list decoding method.

A memory system using such a polar code is described below.

FIG. 1 is a block diagram of a memory system 1000A according to at least one example embodiment of the inventive concepts.

Referring to FIG. 1, the memory system 1000A includes a memory controller 100 and a memory device 200.

The memory device 200 may be a nonvolatile memory device. For example, the memory device 200 may be a flash memory device, phase change RAM (PRAM), ferroelectric RAM (FRAM), magnetic RAM (MRAM), etc. The memory device 200 may be a combination of at least one nonvolatile memory device and at least one volatile memory device or a combination of at least two types of nonvolatile memory devices.

The memory device 200 may be a single flash memory chip. Also, the memory device 200 may include a plurality of flash memory chips.

The memory controller 100 includes a processor 110, an encoder 120, a decoder 130, RAM 140, a host interface 150, a memory interface 160, and a bus 170.

The processor 110 is electrically connected to the encoder 120, the decoder 130, the RAM 140, the host interface 150, and the memory interface 160 via the bus 170.

The bus 170 is a transmission path through which information is transmitted between elements of the memory controller 100.

The processor 110 controls the overall operation of the memory system 1000A. In detail, the processor 110 controls the memory system 1000A to decrypt a command received from a host and to perform an operation according to a result of decryption.

The processor 110 provides the memory device 200 with a read command and an address during a reading operation and provides the memory device 200 with a write command, an address, and an encoded codeword during a writing operation. In addition, the processor 110 converts a logical address received from a host into a physical page address by using metadata stored in the RAM 140. The term 'processor', as used herein, may refer to, for example, a hardware-implemented data processing device having circuitry that is physically structured to execute desired operations including, for example, operations represented as code and/or instructions included in a program. Examples of the above-referenced hardware-implemented data processing device include, but are not limited to, a microprocessor, a central processing unit (CPU), a processor core, a multiprocessor, an application-specific integrated circuit (ASIC), and a field programmable gate array (FPGA).

Data transmitted from the host and data generated by the processor 110, or data read from the memory device 200 may be temporarily stored in the RAM 140. Metadata read from the memory device 200 may also be stored in the RAM 140. In addition, information required for an encoding or decoding process may also be stored in the RAM 140. For example, the information required for an encoding or decoding process may include parameter information (N, K, $A, u_{A^c}$), frozen bit position information, frozen bit information, generation matrix information, reliability threshold value information, maximum list size information, and the like. The information required for an encoding or decoding process is described in detail below. The RAM 140 may be dynamic RAM (DRAM), static RAM (SRAM), or the like.

The metadata is information generated by the memory system 1000A to manage the memory device 200. The metadata that is management information includes mapping table information that is used to convert a logical address into a physical page address of the memory device 200. For example, the metadata may include page mapping table information that is required to perform address mapping in units of pages. In addition, the metadata may also include information for managing a storage space of the memory device 200.

The host interface 150 may be implemented by a circuit, for example an electronic circuit, that includes and/or implements a protocol for data exchange with the host that is connected to the memory device 200 and connects the memory device 200 and the host to each other. The host interface 150 may be, for example, an advanced technology attachment (ATA) interface, a serial advanced technology attachment (SATA) interface, a parallel advanced technology attachment (PATA) interface, a universal serial bus (USB) or a serial attached small computer system (SAS) interface, a small computer system interface (SCSI), an embedded multimedia card (eMMC) interface, or a Unix file system (UFS) interface. However, aspects of one or more example embodiments of the inventive concepts are not limited thereto. In detail, the host interface 150 may exchange commands, addresses, and data with the host according to control of the processor 110.

The memory interface 160 may be implemented by a circuit, for example an electronic circuit, that is electrically connected to the memory device 200. The memory interface 160 may be configured to support an interface with a NAND flash memory chip or a NOR flash memory chip. The memory interface 160 may be configured so that software and hardware interleaving operations may be selectively performed via a plurality of channels.

When power is supplied to the memory system 1000A, the processor 110 controls the memory system 1000A to read metadata or information required for an encoding or decoding process, which is stored in the memory device 200, and to store the read metadata or the read information in the RAM 140. The processor 110 controls the memory system 1000A to update the metadata stored in the RAM 140 according to an operation of changing the metadata in the memory device 200. In addition, the processor 110 controls the memory system 1000A to write the metadata stored in the RAM 140 into the memory device 200 before the memory system 1000A is turned off (POWER OFF).

In a writing operation, the processor 110 controls the memory controller 100 so that the encoder 120 encodes an information word received from the host according to an encoding method of at least one example embodiment of the inventive concepts. In a reading operation, the processor 110 controls the memory controller 100 so that the decoder 130 decodes data read from the memory device 200 according to a decoding method of at least one example embodiment of the inventive concepts.

The encoder 120 may be implemented by a circuit, for example an electronic circuit, that encodes the information word received from the host by using a polar code. The polar code may include a binary polar code or a non-binary polar code. In detail, a frozen bit is combined with the information word received from the host to generate an input symbol vector, and codeword symbols are generated by using the generated input symbol vector and a generation matrix.

The decoder 130 may be implemented by a circuit, for example an electronic circuit, that decodes data read from the memory device 200 based on a decoding method for a polar code according to at least one example embodiment of the inventive concepts. For example, the decoder 130 may calculate the reliability of a decoding path in a list decoding process for a polar code and perform a decoding operation based on the calculated reliability.

The decoder 130 may generate a decoding path list in a manner in which a decoding edge is added to the decoding path list based on the calculated reliability of the decoding path and in which, among decoding paths which are generated based on the decoding edge, decoding paths within a range of the number of critical paths survive in an order of high likelihood probability. Also, the decoder 130 may determine an estimation value, which corresponds to a decoding path having a relatively high or, alternatively, highest or, alternatively, maximum likelihood probability from among decoding paths included in the decoding path list, as an information word.

For example, the decoder 130 may be configured with hardware or software performing an operation of calculating log-likelihood ratios from codeword symbols, which are data read from the memory device 200, an operation of determining the addition of a decoding edge based on the reliability of a decoding path, in the process of generating a tree-type decoding graph for codeword symbols based on the calculated log likelihood ratios and of generating a decoding path list in which among decoding paths which are generated based on the decoding edge, decoding paths within a range of the number of critical paths survive in an order of high likelihood probability, an operation of calculating likelihood probabilities for decoding paths included in the decoding path list, and an operation of outputting an estimation value, which corresponds to a decoding path having a relatively high or, alternatively, highest or, alternatively, maximum likelihood probability of the calculated likelihood probabilities, as an information word.

Figure 2:
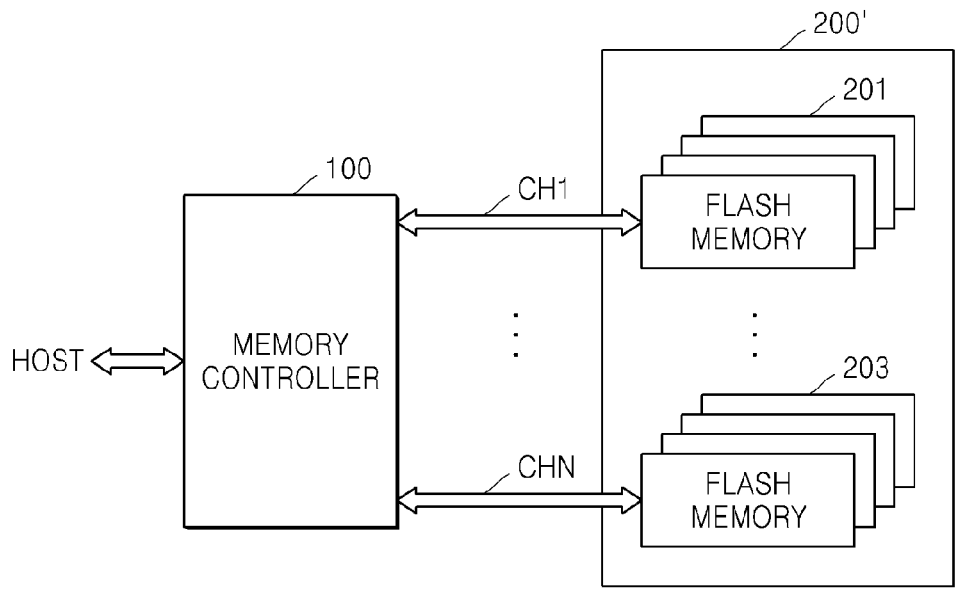
FIG. 2 is a block diagram of a memory system including a plurality of channels, according to at least one example embodiment of the inventive concepts.

FIG. 2 is a block diagram of a memory system 1000B in which a memory device 200' corresponding to the memory device 200 illustrated in FIG. 1 includes a plurality of memory chips to form a plurality of channels and a plurality of ways, according to at least one example embodiment of the inventive concepts.

A solid state drive (SSD) may be implemented by using the memory system 1000B. The SSD is referred to as a solid state disc.

Referring to FIG. 2, the nonvolatile memory device 200' of the memory system 1000B is implemented with a plurality of flash memory chips 201 and 203.

The memory system 1000B has N (where N is a natural number) channels and includes four flash memory chips for each channel. According to one or more example embodiments of the inventive concepts, the number of flash memory chips for each channel may be variously set.

The configuration of the memory controller 100 illustrated in FIG. 2 is substantially the same as that of the memory controller 100 illustrated in FIG. 1, and thus, redundant descriptions thereof will be omitted.

Figure 3:
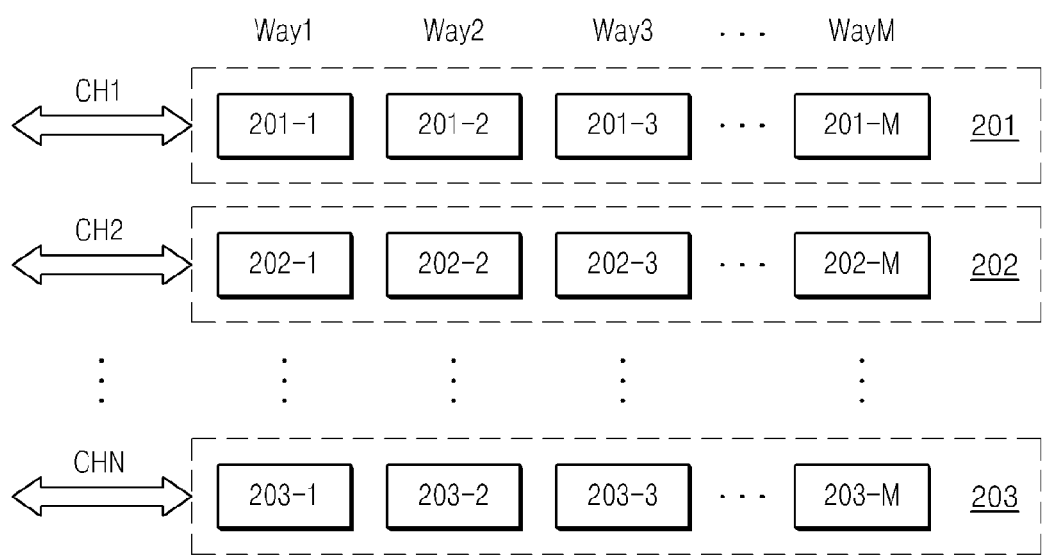
FIG. 3 is a diagram showing a configuration of channels and ways of the memory system illustrated in FIG. 1 or FIG. 2, according to at least one example embodiment of the inventive concepts.

FIG. 3 is a diagram showing a configuration of channels and ways of the memory system 1000B illustrated in FIG. 2, according to at least one example embodiment of the inventive concepts.

A plurality of flash memory chips 201, 202, and 203 may be electrically connected to channels CH1 to CHN, respectively. Each of the channels CH1 to CHN may refer to an independent bus that may receive or transmit a command, an address, and data from or to its corresponding flash memory chip 201, 202, or 203. Each of the plurality of flash memory chips 201 to 203, which are connected to different channels CH1 to CHN, respectively, may operate independently. The plurality of flash memory chips 201 to 203, which are connected to the different channels CH1 to CHN, respectively, may form a plurality of ways way1 to wayM. M flash memory chips may be connected to M ways formed in the channels CH1 to CHN.

For example, flash memory chips 201 may form M ways way1 to wayM at a first channel CH1. Flash memory chips 201-1 to 201-M may be respectively connected to the M ways way1 to wayM at the first channel CH1. The formation relationship between the flash memory chips 201-1 to 201-M, the channels CH1 to CHN, and the M ways way1 to wayM may be applied to the flash memory chips 202 and the flash memory chips 203.

As is illustrated in FIG. 3, a way is the unit for differentiating flash memory chips that share the same channel. The flash memory chips may be differentiated according to a channel number and a way number. It may be determined based on a logical address transmitted from the host which channel and which way of a flash memory chip in which a request provided from the host is to be performed.

Figure 4:
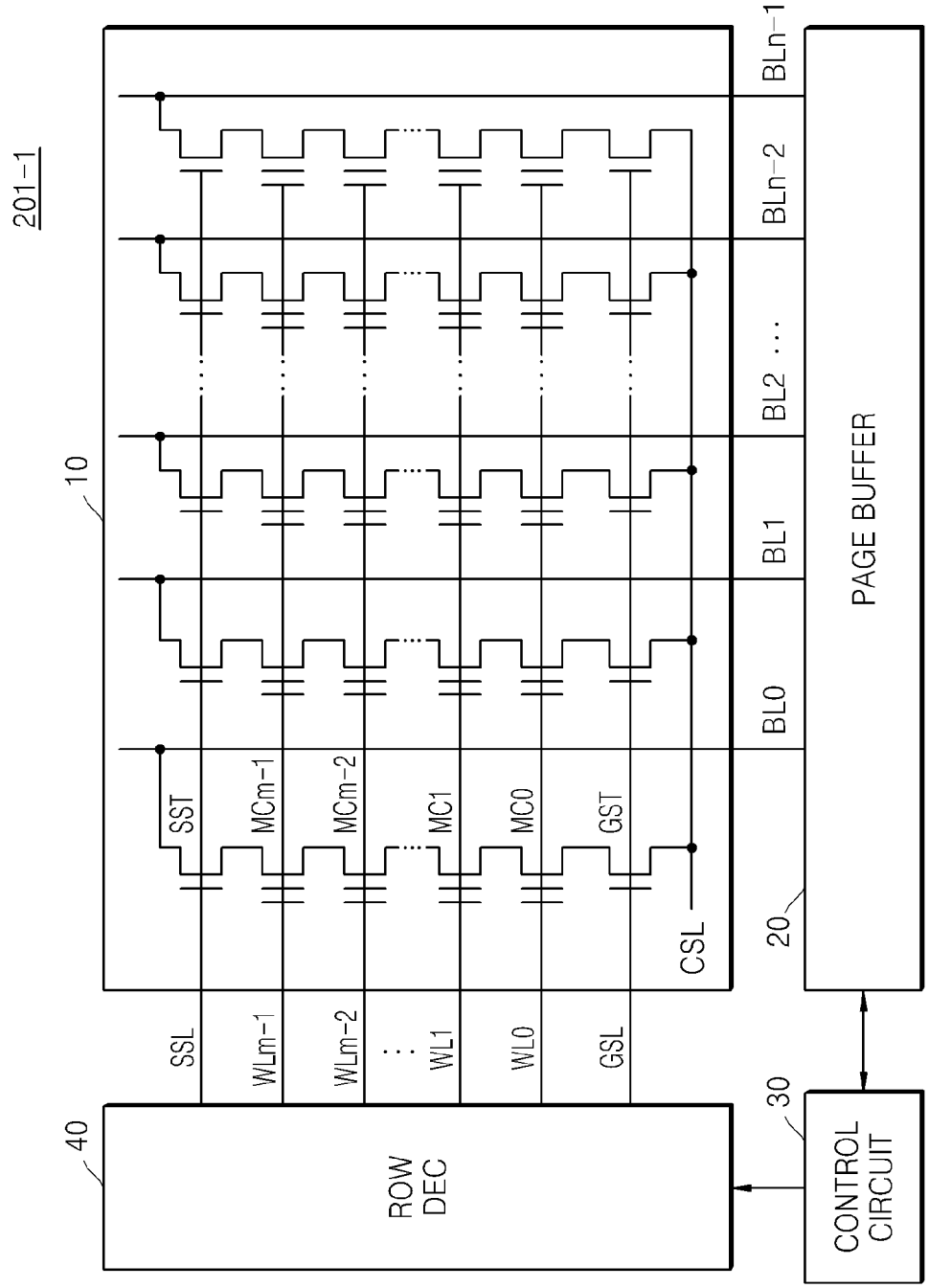
FIG. 4 is a diagram showing a detailed configuration of a flash memory chip included in a memory device illustrated in FIG. 1 or FIG. 2, according to at least one example embodiment of the inventive concepts.

FIG. 4 is a diagram of a circuit configuration of a flash memory chip 201-1 included in the memory device 200' of FIG. 3.

As illustrated in FIG. 4, the flash memory chip 201-1 may include a cell array 10, a page buffer 20, a control circuit 30, and a row decoder 40.

The cell array 10 is an area in which data is written by applying a desired or, alternatively, predetermined voltage to a transistor. The cell array 10 includes memory cells formed where wordlines WL0 to WLm-1 and bitlines BL0 to BLn-1 cross one another. Here, m and n are natural numbers. FIG. 4 illustrates one memory block. However, the cell array 10 may include a plurality of memory blocks. Each of the plurality of memory blocks includes pages corresponding to the wordlines WL0 to WLm-1. Each of the pages includes a plurality of memory cells connected to a wordline corresponding to the memory cells of the wordlines WL0 to WLm-1. The flash memory chip 201-1 performs an erasing operation in units of blocks and performs a programming operation or a reading operation in units of pages.

The memory cell array 10 has a cell string structure. Each cell string includes a string selection transistor SST, a plurality of memory cells MC0 to MCm-1, and a ground selection transistor GST. The string selection transistor SST is connected to a string selection line SSL, the plurality of memory cells MC0 to MCm-1 are respectively connected to the plurality of wordlines WL0 to WLm-1, and the ground selection transistor GST is connected to a ground selection line GSL. The string selection transistor SST is connected between a bitline and a string channel, and the ground selection transistor GST is connected between the string channel and a common source line CSL.

The page buffer 20 is connected to the cell array 10 via the plurality of bitlines BL0 to BLn-1. The page buffer 20 temporarily stores data to be written into the memory cells connected to a selected wordline or data read from the memory cells connected to a selected wordline.

The control circuit 30 generates various voltages required to perform a programming, reading, or erasing operation and controls all operations of the flash memory chip 201-1.

The row decoder 40 is connected to the cell array 10 via the selection lines, namely, the string selection line SSL and the ground selection line GSL, and the plurality of wordlines WL0 to WLm-1. The row decoder 40 receives an address that is input during a programming or reading operation and selects one of the wordlines WL0 to WLm-1 according to the input address. Memory cells in which the programming or reading operation is to be performed are connected to the selected wordline.

In addition, the row decoder 40 applies voltages required to perform the programming or reading operation, for example, a program voltage, a pass voltage, a read voltage, a string selection voltage, and a ground selection voltage, to the selected wordline, unselected wordlines, and the selection lines, namely, the string selection line SSL and the ground selection line GSL.

Each of the memory cells may store 1-bit data or 2 or more-bit data. A memory cell in which 1-bit data is stored is referred to a single level cell (SLC). A memory cell in which 2 or more-bit data is stored is referred to a multi level cell (MLC). The SLC has an erased state or a programmed state according to a threshold voltage.

Figure 5:
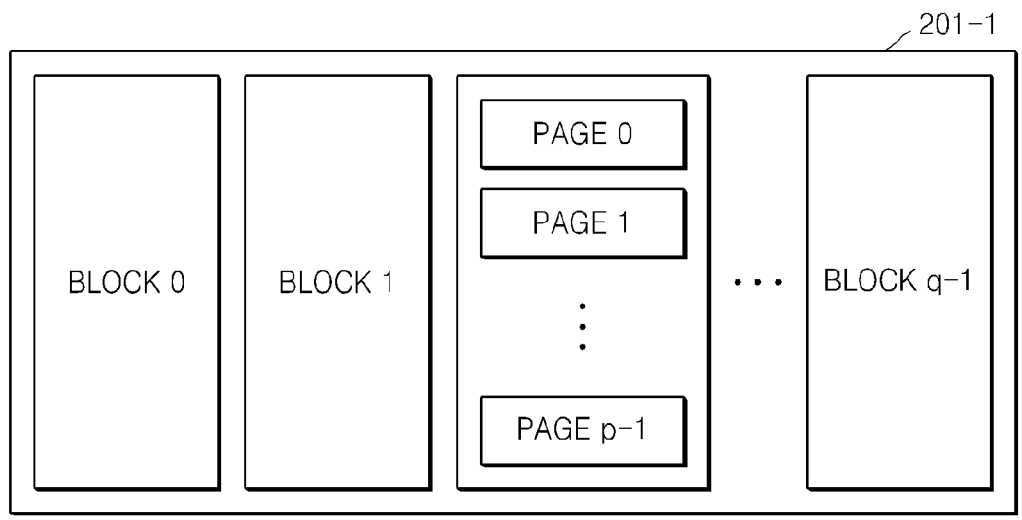
FIG. 5 is a conceptual diagram of an internal structure of a flash memory chip, according to at least one example embodiment of the inventive concepts.

As illustrated in FIG. 5, the internal structure of the flash memory chip 201-1 includes a plurality of blocks, and each of the plurality of blocks includes a plurality of pages.

Data is written into or read from the flash memory chip 201-1 in units of pages, and electrical erasing is performed in units of blocks. In addition, an electrical erasing operation on a block is required to be performed before data is written into the flash memory chip 201-1. Thus, an overwriting operation in the flash memory chip 201-1 may not be performed.

In a memory device in which an overwriting operation cannot be performed, user data may not be written into a desired physical region of the flash memory chip 201-1. Thus, when access is requested by the host so as to perform a writing or reading operation, an address converting operation of converting a logical address, which indicates an area in which a writing or reading operation is required to be performed, into a physical page address that indicates a physical area in which data is actually stored or to be stored, is required to be performed.

An operation of converting a logical address into a physical page address, which is performed in the memory system 1000A or 1000B, will now be described with reference to FIG. 6.

Figure 6:
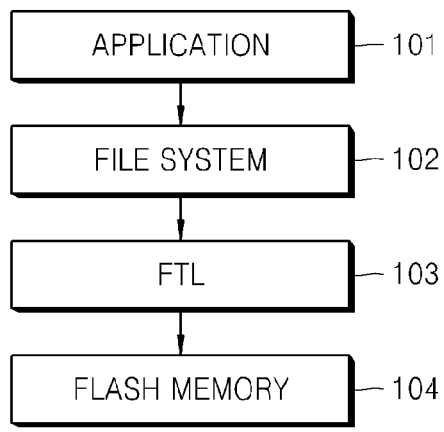
FIG. 6 is a diagram showing a software structure of a processor illustrated in FIG. 1, according to at least one example embodiment of the inventive concepts.

FIG. 6 is a diagram showing a software structure of the memory system 1000A or 1000B. For example, FIG. 6 illustrates a software structure when the memory device 200 is a flash memory.

Referring to FIG. 6, the memory system 1000A or 1000B has a software layer structure including an application layer 101, a file system layer 102, a flash translation layer (FTL) 103, and a flash memory layer 104.

The application layer 101 is firmware that processes data in response to a user input from the host. On the application layer 101, user data is processed in response to the user input, and a command for storing the processed user data in a flash memory chip is transferred to the file system layer 102.

A logical address where the user data is to be stored is allocated to the file system layer 102 in response to a command transferred from the application layer 101. The file system layer 102 includes a file allocation table (FAT) file system, an NTFS, or the like.

An operation of converting the logical address transferred from the file system layer 102 into a physical page address for performing a reading/writing operation of the flash memory chip is performed in the FTL 103. The logical address may be converted in the FTL 103 into the physical page address by using mapping information included in metadata. The address converting operation in the FTL 103 may be performed by the processor 110 of the memory controller 100.

Control signals for storing or reading data in or from the flash memory chip are generated in the flash memory layer 104 by accessing the physical page address converted from the logical address.

A decoding method that is performed by the memory system 1000A of FIG. 1 or the memory system 1000B of FIG. 2 is described below.

A successive cancellation decoding method for a polar code according to one or more example embodiments of the inventive concepts is described first.

The successive cancellation decoding method for a polar code is a decoding method that reflects characteristics of polarization channels. The successive cancellation decoding method for a polar code uses information bits $u_1$ to $u_{i-1}$, which are provided by a polarization channel $W_N^{(i)}$, in the process of decoding an i-th information bit to generate a reliable estimation value.

For example, it is assumed that a codeword obtained by decoding an information word $u_1^N$ by using a polar code having a parameter (N, K, $\mathcal{A}$, $u_{\mathcal{A}^c}$) is $x_1^N$. Here, N is the length of the polar code, K is the number of information bits, A is an information set, and $u_{\mathcal{A}^c}$ c is a frozen bit. When a received vector is $y_1^N$ in the successive cancellation decoding method for a polar code, an estimation value $\bar{u}_1^N$ of the information word is estimated based on the received vector $y_1^N$, the information set A, and the frozen bit $u_{\mathcal{A}^c}$ c.

In the successive cancellation decoding method for a polar code, information bits $u_1$ to $u_N$ are subsequently decoded. When decoding an i-th information word bit, it is assumed that variable nodes corresponding to already decoded first through (i-1)th information word bits and message values of associated edges are already known, and such information is reflected to a decoding graph for the i-th information word bit. In addition, since values of information word bits after the i-th information word bit are not yet determined, a log-likelihood ratio value is zero, and thus, three order-check nodes connected to variable nodes corresponding thereto are excluded from the decoding graph for the i-th information word bit.

Figure 7:
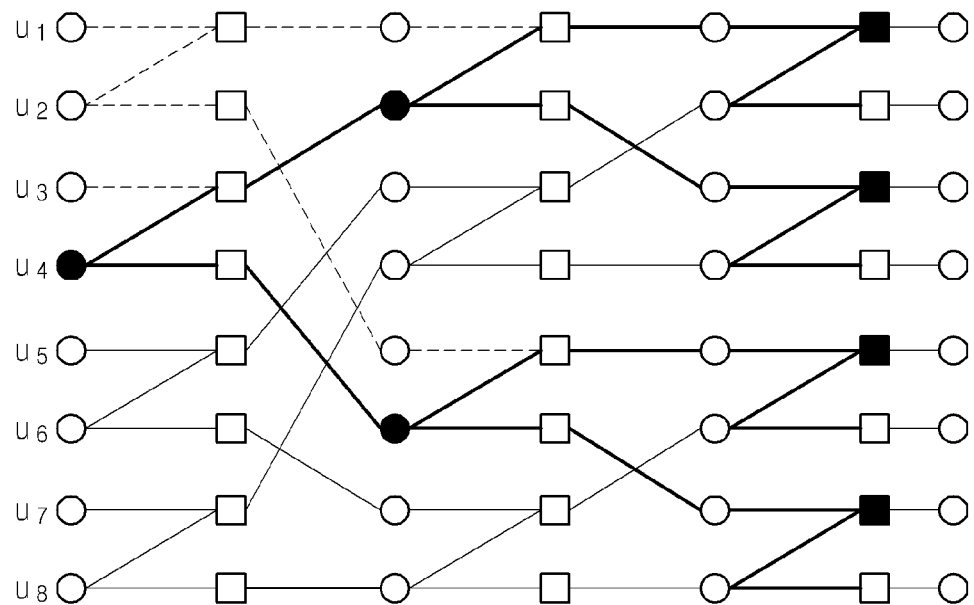
FIG. 7 is a decoding graph showing an example of a decoding process that is performed by a successive cancellation decoding method for a polar code, according to at least one example embodiment of the inventive concepts.

FIG. 7 is a decoding graph showing an example of a decoding process that is performed by a successive cancellation decoding method for a polar code, according to at least one example embodiment of the inventive concepts.

The decoding graph of FIG. 7 shows an example of a process of decoding a fourth information word bit $u_4$ of a polar code, a length of which is 8. A thick solid line in FIG. 7 indicates segments for the fourth information word bit $u_4$, and a dashed line in FIG. 7 indicates segments reflecting information of already-decoded information word bits.

The successive cancellation decoding method for a polar code includes performing a graph-based decoding process and calculating a log-likelihood ratio that is represented by Equation 1.

$$L_N^{(i)}(y_i^N, \hat{u}_1^{i-1}) = \log \frac{W_N^{(i)}(y_1^N, \hat{u}_1^{i-1} | u_i = 0)}{W_N^{(i)}(y_1^N, \hat{u}_1^{i-1} | u_i = 1)} \quad \text{[Equation 1]}$$

The log-likelihood ratio that is represented by Equation 1 with respect to a codeword length N may be repeatedly calculated as in Equation 2 by using structural characteristics of the polar code.

$$L_N^{(2i-1)}(y_1^N, \hat{u}_1^{2i-2}) = \quad \text{[Equation 2]}$$
$$2 \tanh^{-1}(\tanh(L_{N/2}^{(i)}(y_1^{N/2}, \hat{u}_{1,o}^{2i-2} \oplus \hat{u}_{1,e}^{2i-2})/2) \times$$
$$\tanh(L_{N/2}^{(i)}(y_{N/2+1}^N, \hat{u}_{1,e}^{2i-2})/2))$$
$$L_N^{(2i)}(y_1^N, \hat{u}_1^{2i-1}) = (-1)^{\hat{u}_{2i-1}} \times L_{N/2}^{(i)}(y_1^{N/2}, \hat{u}_{1,o}^{2i-2} \oplus \hat{u}_{1,e}^{2i-2}) +$$
$$L_{N/2}^{(i)}(y_{N/2+1}^N, \hat{u}_{1,e}^{2i-2}).$$

Here, $a_{1,o}^j$ is a subvector formed of an element of $a_1^j$ having an odd index, $a_{1,e}^j$ is a subvector formed of an element of $a_1^j$ having an even index, and a condition $L_1^{(1)}(y_i) = \log(W(y_i|u_i=0)/W(y_i|u_i=1))$ is set.

When a log-likelihood ratio of an i-th information word bit is calculated, $u_i$ is estimated based on the calculated log-likelihood ratio. If the i-th information word bit is a frozen bit, it is determined that $\hat{u}_{\mathcal{A}^c}$ c=$u_{\mathcal{A}^c}$ c because $u_i$, which is i∈$\mathcal{A}^c$, is already known, and any decoding is not performed. On the contrary, in the case of i∈$\mathcal{A}^c$, it is determined that depending on a sign of a log-likelihood ratio calculated based on Equation 1, an estimation value $\hat{u}_i$ is zero when $L_N^{(i)}(y_1^N, \bar{u}_1^{i-1})$ has a positive value and is one when $L_N^{(i)}(y_1^N, \bar{u}_1^{i-1})$ has a negative value.

Next, a normal list decoding method for a polar code, according to at least one example embodiment of the inventive concepts, is described.

The normal list decoding method for a polar code is a method obtained by generalizing the successive cancellation decoding method. The normal list decoding method includes performing a successive cancellation decoding on each maximum $L_{max}$ decoding path and then selecting an estimation value, which corresponds to a decoding path having a relatively high or, alternatively, highest or, alternatively, maximum likelihood from among the maximum $L_{max}$ decoding paths, as an information word. As will be discussed in greater detail below, paths referred to as $L_{max}$ decoding paths are decoding paths included in a decoding path list having a maximum list size $L_{max}$. Decoding paths included within the $L_{max}$ decoding paths may be a number decoding paths having a high or highest likelihood probability from among a larger group of decoding paths. As a maximum list size $L_{max}$ increases, the normal list decoding method provides an excellent decoding performance, compared to the successive cancellation decoding method. However, the normal list decoding method causes high complexity and time delay in the process of considering several decoding paths.

Figure 8:
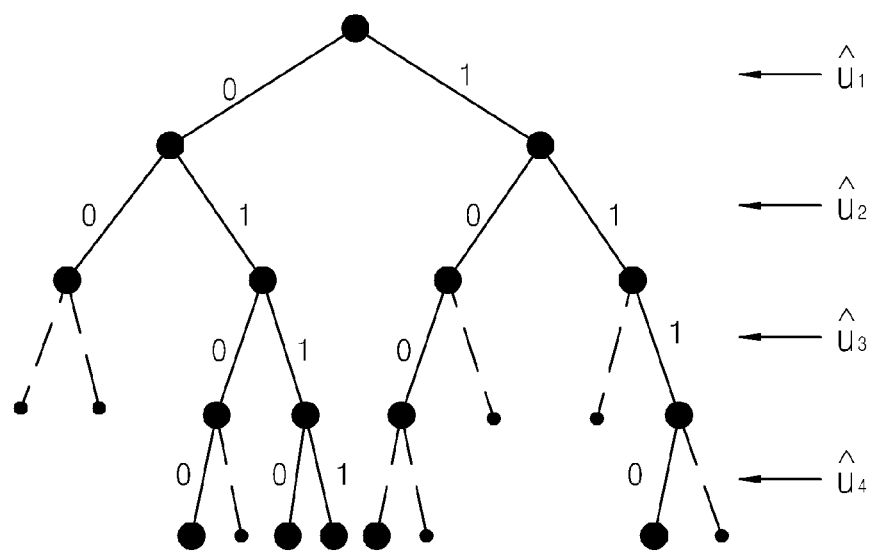
FIG. 8 is a tree-type decoding graph showing an example of a decoding process that is performed by a normal list decoding method for a binary polar code, according to at least one example embodiment of the inventive concepts.

FIG. 8 is a tree-type decoding graph showing an example of a decoding process that is performed by a normal list decoding method for a binary polar code, according to at least one example embodiment of the inventive concepts.

The tree-type decoding graph illustrated in FIG. 8 shows a list decoding process for a binary polar code when an information word length N is 4 and a maximum list size $L_{max}$ is 4.

The normal list decoding method for a binary polar code includes dividing a decoding path having a length (i-1), which is currently being processed, when decoding an i-th information bit and providing two decoding edges corresponding to "0" and "1", respectively. When the list decoding process is performed sequentially according to indexes of bits, the total number of decoding paths exponentially increases. If the number L of current decoding paths exceeds the maximum list size $L_{max}$, only $L_{max}$ decoding paths having relatively high likelihood probability remain in a decoding path list and the remaining decoding paths are removed from the decoding path list.

When a decoding edge corresponding to a bit $u_N$ is finally added to the decoding path list and thus all decoding paths are determined, one decoding path having a relatively high or, alternatively, highest or, alternatively, maximum likelihood probability is selected based on Equation 3 and estimation bits corresponding to the selected decoding path are determined as an information word.

$$\hat{u}_1^N = \arg\max_{(\hat{u}_1^N)_k} \Pr\{y_1^N \mid (\hat{u}_1^N)_k\} \quad \text{[Equation 3]}$$

$$= \arg\max_{(\hat{u}_1^N)_k} \Pr\{(\hat{u}_1^N)_k \mid y_1^N\}$$

$$= \arg\max_{(\hat{u}_1^N)_k} \prod_{i=1}^{N} \Pr\{u_i = (\hat{u}_i)_k \mid y_1^N, (\hat{u}_1^{i-1})_k\}$$

$$= \arg\max_{(\hat{u}_1^N)_k} \prod_{i=1}^{N} \frac{\exp[(1 - (\hat{u}_i)_k) \cdot L_N^{(i)}(y_1^N, (\hat{u}_1^{i-1})_k)]}{1 + \exp[L_N^{(i)}(y_1^N, (\hat{u}_1^{i-1})_k)]}$$

With respect to $1 \leq k \leq L \leq L_{max}$, $(\hat{u}_1^N)_k$ denotes an estimation value corresponding to a k-th decoding path of L decoding paths included in the list.

A normal list decoding process for a binary polar code having the maximum list size $L_{max}$ may be summarized as follows:

[A Normal List Decoding Process for a Binary Polar Code]

Process 1: The current list size L is set to "1".

Process 2: With respect to $1 \leq i \leq N$ and $1 \leq k \leq L \leq L_{max}$, a decoding edge corresponding to a bit $(u_i)_k$ is added to a decoding path list to determine decoding paths. Process 2 includes Process 2-1 to Process 2-3.

Process 2-1: In the case of $i \in \mathcal{A} \cdot u_{\mathcal{A}^c}{}^c$, a decoding edge corresponding to $(\hat{u}_i)_k = u_i$ is added to the decoding path list. In this case, the current list size L is not changed.

Process 2-2: In the case of $i \in \mathcal{A} \cdot u_{\mathcal{A}^c}$, a decoding edge corresponding to "0" and a decoding edge corresponding to "1" are added to the decoding path list, and the current list size L is updated to L+1.

Process 2-3: In the case of $L \geq L_{max}$, only $L_{max}$ decoding paths in which a value of $\Pr\{(\hat{u}_1^N)_k | y_1^N\}$ is relatively large survive in the decoding path list and decoding paths other than the $L_{max}$ decoding paths are removed from the decoding path list.

Process 3: A decoding path having a relatively high or, alternatively, highest or, alternatively, maximum likelihood probability is selected from among finally determined surviving decoding paths based on Equation 3, and an estimation value corresponding to the selected decoding path is determined as a transmitted information word.

In the normal list decoding method, the calculation complexity of $\Pr\{(\hat{u}_1^N)_k | y_1^N\}$ that is calculated in Process 2-3 is relatively high.

Next, a new list decoding method for a polar code, according to at least one example embodiment of the inventive concepts, is described below.

The new list decoding method for a polar code is a decoding method in which the complexity in Process 2-3 of the above-described normal list decoding method is lowered.

The new list decoding method for a polar code includes generating a decoding path list in which among decoding paths having a reliability that is equal to or higher than a threshold reliability, decoding paths within a range of the number of critical paths survive in an order of high likelihood probability in the process of generating a tree-type decoding graph for input codeword symbols, and determining an estimation value, which corresponds to a decoding path having a relatively high or, alternatively, highest or, alternatively, maximum likelihood probability from among decoding paths of the generated decoding path list, as an information word.

The new list decoding method for a polar code is divided into a list decoding method for a binary polar code and a list decoding method for a non-binary polar code.

First, a new list decoding method for a binary polar code, according to at least one embodiment of the inventive concepts, is described.

When a polarization channel generated by polarizing a binary input discrete memoryless channel W:x→y is defined as $W_N^{(i)}: X \to y^N \times X^{i-1}$, $1 \leq i \leq N$, a log-likelihood ratio, which is calculated when a list decoder having a maximum list size $L_{max}$ decodes an estimation value $(\hat{u}_i)_k$ (where $1 \leq k \leq L \leq L_{max}$) corresponding to a k-th decoding path of L decoding paths included in the current list, is represented by Equation 4.

$$L_N^{(i)}(y_1^N, (\hat{u}_1^{i-1})_k) = \log \frac{W_N^{(i)}(y_1^N, (u_1^{i-1})_k \mid (u_i)_k = 0)}{W_N^{(i)}(y_1^N, (u_1^{i-1})_k \mid (u_i)_k = 1)} \quad \text{[Equation 4]}$$

A parameter denoting a reliability threshold value of a decoding path is defined as $T_{LLR}$. If the absolute value of a log-likelihood ratio $L_N^{(i)}(y_1^N, (\hat{u}_1^{i-1})_k)$, which is calculated by Equation 4 when decoding an information bit $(u_i)_k$ with respect to $i \in \mathcal{A} \cdot u_{\mathcal{A}^c}$, is greater than the reliability threshold value $T_{LLR}$, it is determined that the k-th decoding path has sufficient reliability, and the estimation value $(\hat{u}_i)_k$ may be determined according to the sign of the log-likelihood ratio $L_N^{(i)}(y_1^N, (\hat{u}_1^{i-1})_k)$. On the contrary, if the absolute value of the log-likelihood ratio $L_N^{(i)}(y_1^N, (\hat{u}_1^{i-1})_k)$ is less than or equal to the reliability threshold value $T_{LLR}$, it is determined that the reliability of the k-th decoding path is relatively low, and thus, the k-th decoding path is separated from a decoding path list. When a list decoding process is performed in this manner, the possibility of unnecessary separation of decoding paths from the decoding path list is reduced, and thus, decoding paths having a relatively high reliability may be efficiently configured.

Figure 9:
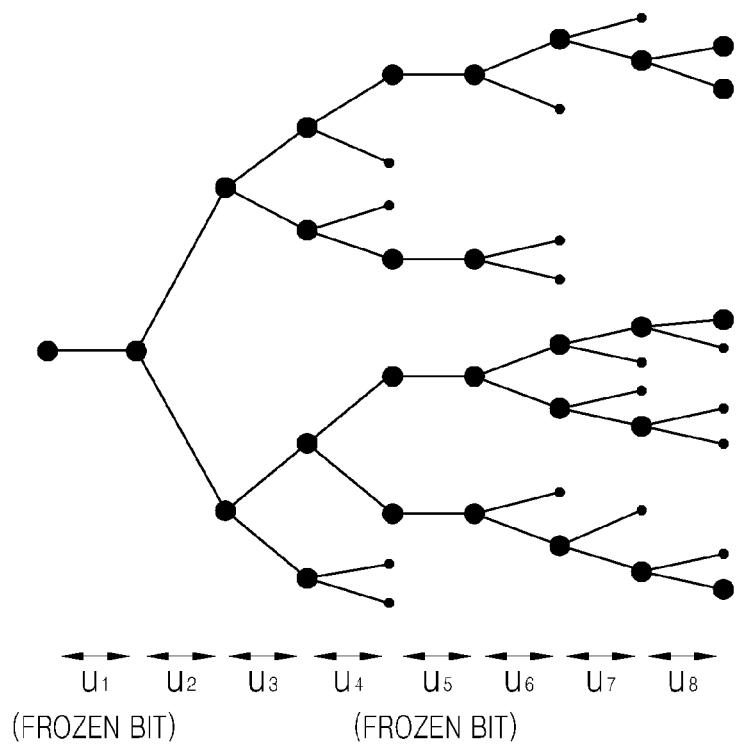
FIG. 9 is a tree-type decoding graph showing an example of a decoding process that is performed by a normal list decoding method for a binary polar code including a frozen bit, according to at least one example embodiment of the inventive concepts.

FIG. 9 is a tree-type decoding graph showing an example of a decoding process that is performed by a normal list decoding method for a binary polar code including a frozen bit, according to at least one example embodiment of the inventive concepts.

Figure 10:
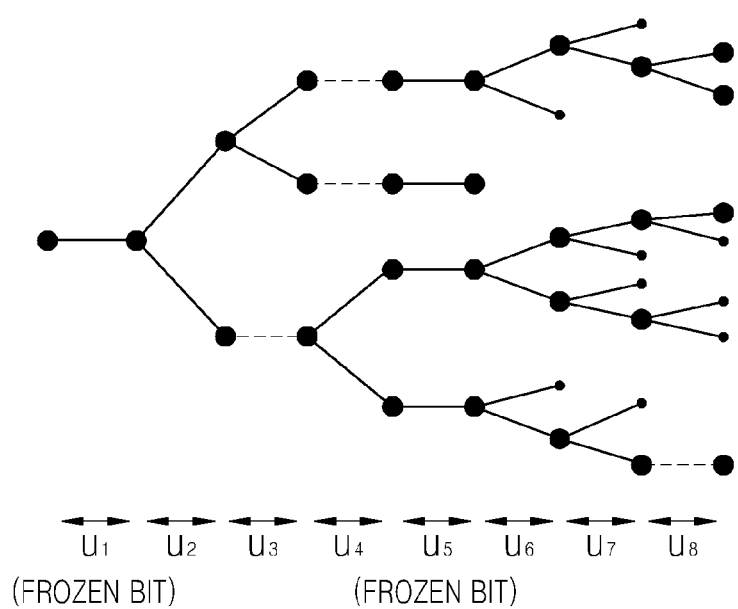
FIG. 10 is a tree-type decoding graph showing an example of a decoding process that is performed by a new list decoding method for a binary polar code, according to at least one example embodiment of the inventive concepts.

FIG. 10 is a tree-type decoding graph showing an example of a decoding process that is performed by a new list decoding method for a binary polar code, according to at least one example embodiment of the inventive concepts.

The tree-type decoding graph illustrated in FIG. 9 shows a normal list decoding method for a binary polar code in the case where N is 8, K is 6, $A^c$ is $\{1,5\}$, and $L_{max}$ is 4, and the tree-type decoding graph illustrated in FIG. 10 shows a new list decoding method for a binary polar code in the case where N is 8, K is 6, $A^c$ is $\{1,5\}$, and $L_{max}$ is 4.

Referring to FIG. 9, the normal list decoding method for a binary polar code includes adding a decoding edge corresponding to "0" and a decoding edge corresponding to "1" to a decoding path list when estimating all information word bits other than frozen bits $u_1$ and $u_5$.

On the other hand, referring to FIG. 10, a decoding process that is performed by the new list decoding method of FIG. 10 is relatively simple, compared to a decoding process that is performed by the normal list decoding method of FIG. 9. This is because with respect to decoding paths having a relatively high reliability, information bits thereof are directly estimated without separating the decoding paths from the decoding path list. The dashed line shown in FIG. 10 represents a process of directly estimating the information bits with respect to the decoding paths having a relatively high reliability when decoding non-frozen information bits.

The new list decoding method for a polar code, in which a decoding path may be separated from the decoding path list based on the reliability of the decoding path, may include performing the following processes:

[A New List Decoding Method for a Binary Polar Code]

Process 1A: The current list size L is set to "1".

Process 2A: With respect to $1 \leq i \leq N$ and $1 \leq k \leq L \leq L_{max}$, a decoding edge corresponding to a bit $(u_i)_k$ is added to a decoding path list to determine decoding paths. Process 2A includes Process 2-1A to Process 2-4A.

Process 2-1A: In the case of $i \in A \cdot u_{A^c}{}^c$, a decoding edge corresponding to $(\hat{u}_i)_k = u_i$ is added to the decoding path list. In this case, the current list size L is not changed.

Process 2-2A: In the case of $i \in A \cdot u_{A^c}$ and $|L_N{}^{(i)}(y_1{}^N, (\hat{u}_1{}^{i-1})_k)| > T_{LLR}$, a decoding edge corresponding to $(\hat{u}_i)_k = h(L_N{}^{(i)}(y_1{}^N, (\hat{u}_1{}^{i-1})_k))$ is added to the decoding path list. In this case, h(z) is a function defined as follows:

$$h(z) = \begin{cases} 0, & \text{if } z > 0, \\ 1, & \text{otherwise.} \end{cases}$$

where the current list size L is not changed.

Process 2-3A: In the case of $i \in A \cdot u_{A^c}$ and $|L_N{}^{(i)}(y_1{}^N, (\hat{u}_1{}^{i-1})_k)| \leq T_{LLR}$, a decoding edge corresponding to "0" and a decoding edge corresponding to "1" are added to the decoding path list, and the current list size L is updated to L+1.

Process 2-4A: In the case of $L > L_{max}$, only $L_{max}$ decoding paths in which a value of $Pr\{(\hat{u}_1{}^N)_k | y_1{}^N\}$ is relatively large survive in the decoding path list and decoding paths other than the $L_{max}$ decoding paths are removed from the decoding path list.

Process 3A: A decoding path having a relatively high or, alternatively, highest or, alternatively, maximum likelihood probability is selected from among finally determined surviving decoding paths based on Equation 3, and an estimation value corresponding to the selected decoding path is determined as a transmitted information word.

Through such processes, a decoding edge having a reliability that is equal to or higher than a threshold reliability is added to a decoding path list. In other words, among decoding edges corresponding to bit values that may be estimated in the case that a decoding symbol is an information bit, a decoding edge having a reliability that is less than the threshold reliability is not added to the decoding path list. That is, in the case that the absolute value of $L_N{}^{(i)}(y_1{}^N, (\hat{u}_1{}^{i-1})_k)$ is greater than the reliability threshold value $T_{LLR}$, it is determined that reliability is relatively high, and thus, only one decoding edge indicating a bit value corresponding to $(\hat{u}_i)_k = h(L_N{}^{(i)}(y_1{}^N, (\hat{u}_1{}^{i-1})_k))$ is added to the decoding path list. In this case, it is determined that a decoding edge indicating a bit value that is different from the bit value corresponding to $(\hat{u}_i)_k = h(L_N{}^{(i)}(y_1{}^N, (\hat{u}_1{}^{i-1})_k))$ has a reliability that is less than the threshold reliability, and thus, the decoding edge indicating the different bit value is not added to the decoding path list.

Next, a new list decoding method for a non-binary polar code, according to at least one embodiment of the inventive concepts, is described.

Here, a new list decoding method for a non-binary polar code defined on a finite field GF(q) (where q is greater than 2) is considered. In the new list decoding method for a non-binary polar code, when decoding an i-th decoding symbol $u_i \in GF(q)$ (where $1 \leq i \leq N$), a decoding path having a length (i-1) which is underway is separated from a current decoding path and q decoding edges corresponding to 0, 1, a, $a^2$, ..., $a^{n-2}$, respectively, are added to the decoding path list. Here, a denotes a primitive element of the finite field GF(q).

Figure 11:
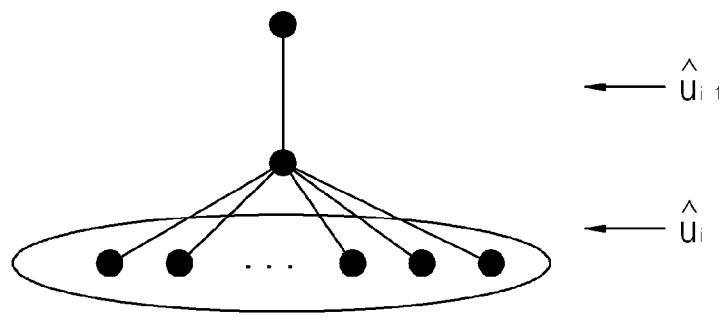
FIG. 11 is a diagram showing a decoding path separation process that is performed by a list decoding method for a non-binary polar code, according to at least one example embodiment of the inventive concepts.

FIG. 11 is a diagram showing a decoding path separation process that is performed by a list decoding method for a non-binary polar code, according to at least one example embodiment of the inventive concepts.

When a list decoding process is performed sequentially according to indexes of input symbols, the number of total decoding paths increases exponentially with respect to the size q of the finite field GF(q) and thus the decoding complexity of the list decoding process greatly increases.

The list decoding process for a non-binary polar code may be simplified by reflecting the reliability of a decoding path that is being currently underway when separating the decoding path from a decoding path list. In the case of decoding $(\hat{u}_i)_k \in GF(q)$ (where $1 \leq k \leq L \leq L_{max}$), which is an estimation value corresponding to a k-th decoding path of L decoding paths included in the current decoding path list, under a list decoding condition in which a maximum list size is $L_{max}$, a symbol $(u_i)_{k,max} \in GF(q)$ having a maximum value of transition probabilities of a polarization channel, wherein the transition probabilities are calculated in the decoding process, is represented by Equation 5.

$$(u_i)_{k,max} = \arg\max_{(u_i)_k \in GF(q)} w_N{}^{(i)}(y_i{}^N, (\hat{u}_i{}^{i-1})_k)(u_i)_k) \quad \text{[Equation 5]}$$

A reliability value $T((u_i)_k)$ of a decoding path corresponding to an information bit $(u_i)_k$ may be calculated by using Equation 6.

$$T((u_i)_k) = \log \frac{W_N^{(i)}(y_1^N, (\hat{u}_i^{i-1})_k \mid (u_i)_{k,max})}{W_N^{(i)}(y_1^N, (\hat{u}_i^{i-1})_k \mid (u_i)_k)} \quad \text{[Equation 6]}$$

If the reliability value $T((u_i)_k)$ of a decoding path, calculated by Equation 6 when decoding the information bit $(u_i)_k$ with respect to $i \in \mathcal{A}, u_{\mathcal{A}^c}$, is less than or equal to the reliability threshold value $T_{LLR}$, a decoding edge corresponding to the information bit $(u_i)_k$ is added to a decoding path list. That is, if the reliability value $T((u_i)_k)$ of a decoding path is less than or equal the reliability threshold value $T_{LLR}$, it is determined that the reliability of a decoding path corresponding to the information bit $(u_i)_k$ has a high reliability that is equal to or greater than a threshold reliability, and thus, a decoding edge corresponding to the information bit $(u_i)_k$ is added to the decoding path list.

If the reliability value $T((u_i)_k)$ of a decoding path, calculated by Equation 6 when decoding the information bit $(u_i)_k$ with respect to $i \in \mathcal{A}, u_{\mathcal{A}^c}$, is greater than the reliability threshold value $T_{LLR}$, a decoding edge corresponding to the information bit $(u_i)_k$ is not added to the decoding path list. That is, if the reliability value $T((u_i)_k)$ of a decoding path is greater than the reliability threshold value $T_{LLR}$, it is determined that the reliability of a decoding path corresponding to the information bit $(u_i)_k$ has low reliability that is less than the threshold reliability, and thus, a decoding edge corresponding to the information bit $(u_i)_k$ is not added to the decoding path list.

When a list decoding process is performed in such a way, decoding paths having a relatively high reliability may be efficiently configured because decoding paths for information bits $(u_i)_k$ that have a relatively high probability of actually having been transmitted may be considered. When the reliability threshold value $T_{LLR}$ is set to a relatively small value in the case of using the list decoding method for a non-binary polar code, the number of cases in which a decoding path is separated from the decoding path list is reduced, and thus, the complexity of the list decoding method for a non-binary polar code is reduced compared to the normal list decoding method.

The new list decoding method for a non-binary polar code, in which a decoding path is separated from the decoding path list based on the reliability of the decoding path, includes the following processes:

[A New List Decoding Method for a Non-binary Polar Code]

Process 1B: The current list size L is set to "1".

Process 2B: With respect to and $1 \leq i \leq N$ and $1 \leq k \leq L \leq L_{max}$, a decoding edge corresponding to a bits $(u_i)_k \in GF(q)$ is added to a decoding path list to determine decoding paths. Process 2B includes Process 2-1B to Process 2-4B.

Process 2-1B: In the case of $i \in \mathcal{A}, u_{\mathcal{A}^c}$, a decoding edge corresponding to $(\hat{u}_i)_k = u_i$ is added to the decoding path list. In this case, the current list size L is not changed.

Process 2-2B: In the case of $i \in \mathcal{A}, u_{\mathcal{A}^c}$ and $T((u_i)_k) \leq T_{LLR}$, a decoding edge corresponding to $(\hat{u}_i)_k$ is added to the decoding path list and the current list size L is updated to L+1.

Process 2-3B: In the case of $i \in \mathcal{A}, u_{\mathcal{A}^c}$ and $T((u_i)_k) > T_{LLR}$, a decoding edge corresponding to $(\hat{u}_i)_k$ is not considered.

Process 2-4B: In the case of $L > L_{max}$, only $L_{max}$ decoding paths in which a value of $\Pr\{(\hat{u}_1^N)_k | y_1^N\}$ is relatively large survive in the decoding path list and decoding paths other than the $L_{max}$ decoding paths are removed from the decoding path list.

Process 3B: A decoding path having a relatively high or, alternatively, highest or, alternatively, maximum likelihood probability is selected from among finally determined surviving decoding paths, and an estimation value corresponding to the selected decoding path is determined as a transmitted information word.

For example, the reliability threshold value $T_{LLR}$ may be set to be different between the new list decoding method for a binary polar code and the new list decoding method for a non-binary polar code.

The encoder 120 and the decoder 130 of the memory controller 100 illustrated in FIGS. 1 and 2 are described below.

Figure 12:
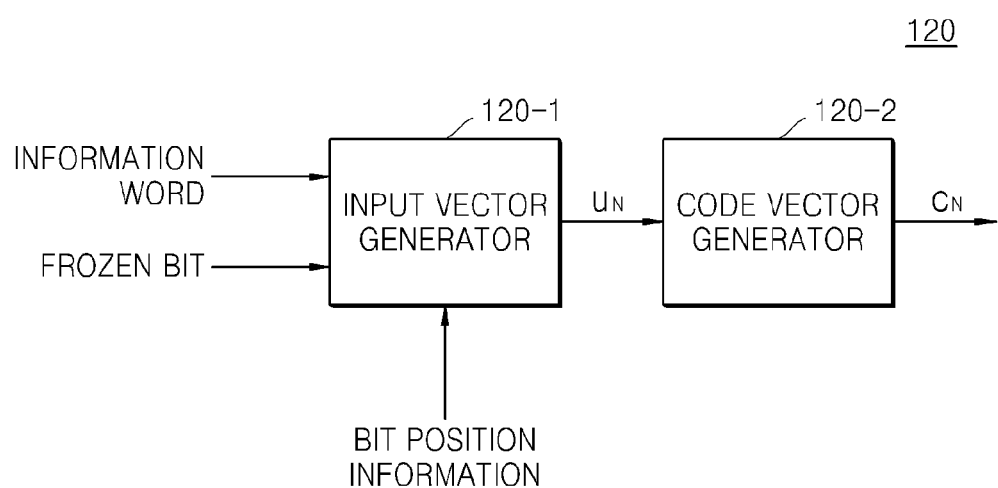
FIG. 12 is a block diagram of an encoder of the memory system illustrated in FIG. 1, according to at least one example embodiment of the inventive concepts.

FIG. 12 is a block diagram of the encoder 120 of the memory controller 100 illustrated in FIG. 1, according to at least one example embodiment of the inventive concepts.

Referring to FIG. 12, the encoder 120 includes an input vector generator 120-1 and a code vector generator 120-2.

The input vector generator 120-1 combines a frozen bit with an information word input during a writing operation to thereby generate an input symbol vector. For example, an information word having a length K log 2(q) is assigned to an information bit position indicated by bit position information transmitted from the memory device 200. Frozen bits are assigned to the remaining information bit positions to thereby generate an input symbol vector $u_N$ having a length N. The information word may be received from a host and then stored in the RAM 140, and the bit position information may be read from the memory device 200 and then stored in the RAM 140. The information word and the bit position information are read from the RAM 140 during a writing operation, and the read information word and the read bit position information are input to the input vector generator 120-1 of the encoder 120.

The code vector generator 120-2 generates a codeword vector symbol $C_N$ by using the input symbol vector $u_N$ and a generation matrix G. For example, the codeword vector symbol $C_N$ may be generated by multiplying the input symbol vector $u_N$ and the generation matrix G. The generation matrix G is a matrix-type transformation operator that is used when forming an error correction code.

The codeword vector symbol $C_N$ generated by the code vector generator 120-2 is written into an area corresponding to an assigned physical page address in the memory device 200 via the memory interface 160.

Figure 13:
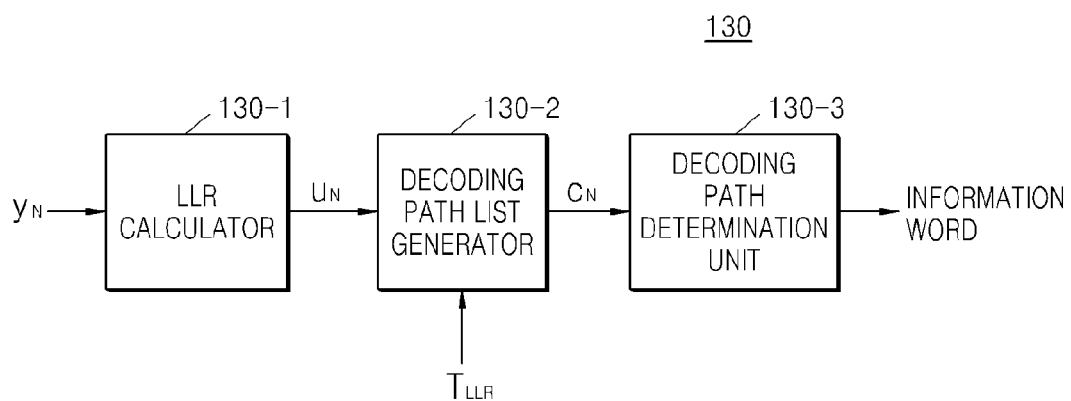
FIG. 13 is a block diagram of a decoder of the memory system illustrated in FIG. 1, according to at least one example embodiment of the inventive concepts.

FIG. 13 is a block diagram of the decoder 130 of the memory controller 100 illustrated in FIG. 1, according to at least one example embodiment of the inventive concepts.

Referring to FIG. 13, the decoder 130 includes a log likelihood ratio (LLR) calculator 130-1, a decoding path list generator 130-2, and a decoding path determination unit 130-3.

The LLR calculator 130-1 calculates log-likelihood ratios from codeword symbols $y_N$ received from the memory device 200.

The decoding path list generator 130-2 generates a decoding path list to which a decoding edge is selectively added in the process of generating a tree-type decoding graph for codeword symbols based on the log-likelihood ratios calculated by the LLR calculator 130-1 and in which decoding paths within a range of the number of critical paths survive in an order of high likelihood probability from among decoding paths which are generated based on the decoding edge.

For example, the decoding path list generator 130-2 may be designed by using hardware or software that performs Process 1A and Process 2A selected from Processes 1A to 3A of the above-described new list decoding method for a binary polar code. That is, the decoding path list generator 130-2 may perform any or all of Process 1A, Process 2-1A, Process 2-2A, Process 2-3A, and Process 2-4A of the above-described new list decoding method for a binary polar code.

As another example, the decoding path list generator 130-2 may be designed by using hardware or software that performs Process 1B and Process 2B of Processes 1B to 3B of the above-described new list decoding method of a non-binary polar code. That is, the decoding path list generator 130-2 may perform any or all of Process 1B, Process 2-1B, Process 2-2B, Process 2-3B, and Process 2-4B of the above-described new list decoding method of a non-binary polar code.

The decoding path determination unit 130-3 calculates likelihood probabilities for decoding paths included in the decoding path list generated by the decoding path list generator 130-2 and outputs an estimated value, which corresponds to a decoding path having a relatively high or, alternatively, highest or, alternatively, maximum likelihood probability of the calculated likelihood probabilities, as an information word.

For example, the decoding path determination unit 130-3 may be designed by using hardware or software that performs Process 3A of Processes 1A to 3A of the above-described new list decoding method of a binary polar code.

As another example, the decoding path determination unit 130-3 may be designed by using hardware or software that performs Process 3B of Processes 1B to 3B of the above-described new list decoding method of a non-binary polar code.

Figure 14:
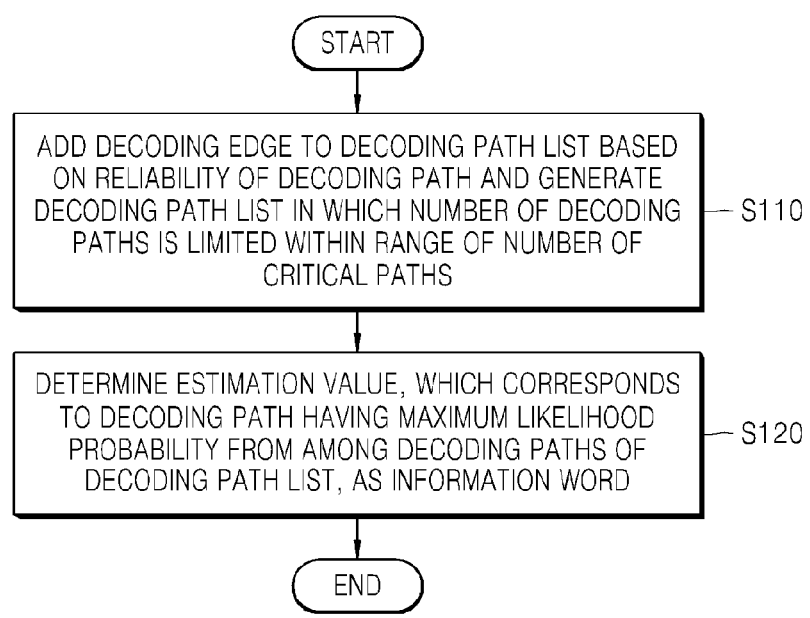
FIG. 14 is a flowchart of a list decoding method for a polar code, according to at least one example embodiment of the inventive concepts.

Next, a list decoding method of a polar code according to one or more example embodiments of the inventive concepts is described in time series order with reference to the flowchart of FIG. 14.

For example, an example in which the operations illustrated in the flowchart of FIG. 14 is performed in the memory system 1000A of FIG. 1 is described. Also, the operations illustrated in the flowchart of FIG. 14 may be performed in various electronic devices, such as the memory system 1000B of FIG. 2 and a server system, as well as the memory system 1000A of FIG. 1. For example, the operations illustrated in the flowchart of FIG. 14 may be performed in the decoder 130 of the memory system 1000A.

The decoder 130 adds a decoding edge to a decoding path list based on the reliability of a decoding path in the process of generating a tree-type decoding graph for input symbols of a codeword and generates the decoding path list in which decoding paths within a range of the number of critical paths survive in an order of high likelihood probability from among decoding paths which are generated based on the decoding edge (Operation S110). The reliability of a decoding path may be determined based on a log-likelihood ratio for the input symbols.

For example, in the process of generating a tree-type decoding graph by using the new list decoding method for a binary polar code, a decoding path having a reliability that is equal to or higher than a threshold reliability is not separated from a decoding path list and information bits corresponding to the decoding path are directly estimated. In the case that the number of generated decoding paths exceeds the number of critical paths, the number of surviving decoding paths is limited to the number of critical paths by removing decoding paths in an order of low likelihood probability.

As another example, in the process of generating a tree-type decoding graph by using the new list decoding method for a non-binary polar code, a decoding path having a reliability that is equal to or higher than a threshold reliability is added to a decoding path list and a decoding path having a reliability that is less than the threshold reliability is not added to the decoding path list. In the case that the number of generated decoding paths exceeds the number of critical paths, the number of surviving decoding paths is limited to the number of critical paths by removing decoding paths in an order of low likelihood probability.

Next, the decoder 130 determines an estimation value, which corresponds to a decoding path having a relatively high or, alternatively, highest or, alternatively, maximum likelihood probability from among decoding paths of the decoding path list, as an information word (Operation S120). For example, when candidate decoding paths are determined according to the decoding path list, the decoder 130 selects one decoding path having a relatively high or, alternatively, highest or, alternatively, maximum likelihood probability based on Equation 3 and determines estimation bits corresponding to the selected decoding path as the information word.

Figure 15:
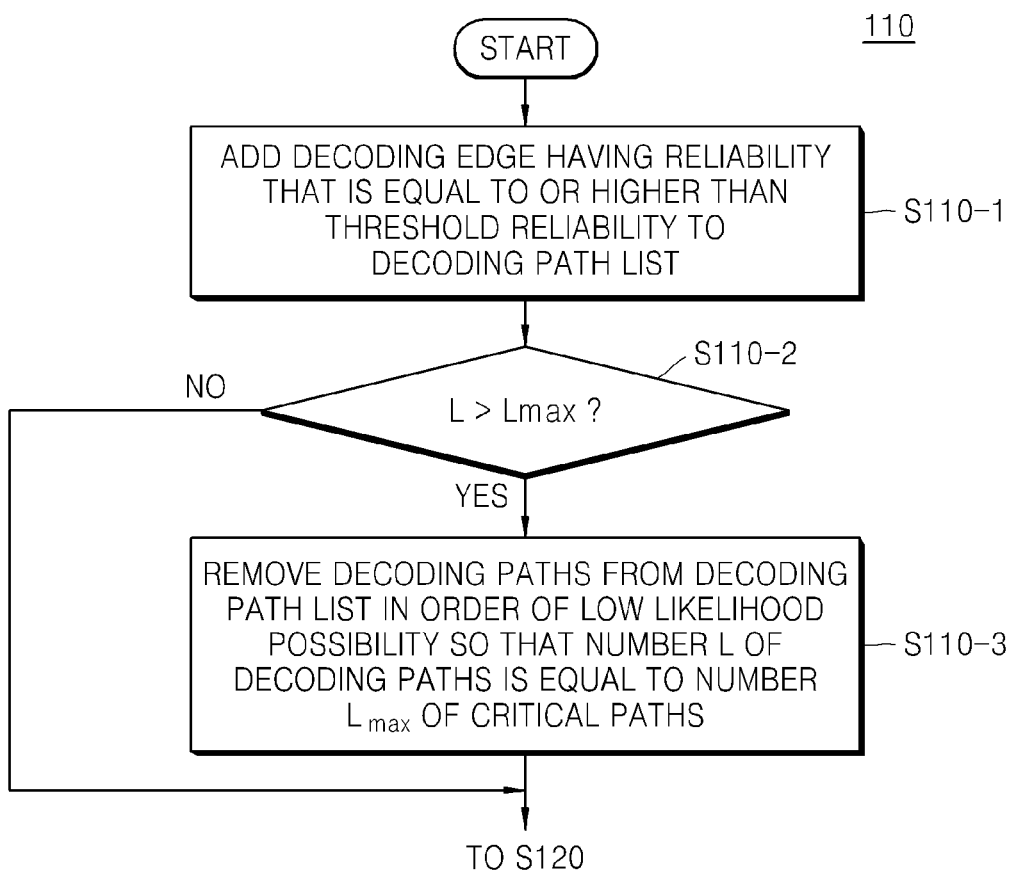
FIG. 15 is a flowchart of an operation of generating a decoding path list, illustrated in FIG. 14, according to at least one example embodiment of the inventive concepts.

FIG. 15 is a flowchart of the operation (Operation S110) of generating a decoding path list, illustrated in FIG. 14, according to at least one example embodiment of the inventive concepts.

The decoder 130 adds a decoding edge having a reliability that is equal to or higher than a threshold reliability to a decoding path list, based on the reliability of a decoding path in the process of generating a tree-type decoding graph for input symbols (Operation S110-1). The decoder 130 may calculate a log-likelihood ratio for input symbols and evaluate the reliability of a decoding path based on the calculated log-likelihood ratio.

For example, when the decoder 130 decodes an information bit $(u_i)_K$ with respect to $i \in \mathcal{A}, u_{\mathcal{A}^c}$ by using the new list decoding method for a binary polar code, the decoder 130 determines that a k-th decoding path has a reliability that is equal to or higher than the threshold reliability if the absolute value of a log-likelihood ratio $L_N^{(i)}(y_1^N, (\hat{u}_1^{i-1})_k)$, which is calculated by Equation 4, is equal to or greater than the reliability threshold value $T_{LLR}$, and thus determines an estimation value $(\hat{u}_i)_k$ according to the sign of the log-likelihood ratio $L_N^{(i)}(y_1^N, (\hat{u}_1^{i-1})_k)$. That is, a decoding path having a reliability that is equal to or higher than the threshold reliability is not separated from a decoding path list and information bits corresponding to the decoding path are directly estimated. Accordingly, a decoding path having a reliability that is less than the threshold reliability is not added to the decoding path list. On the contrary, if the absolute value of the log-likelihood ratio $L_N^{(i)}(y_1^N, (\hat{u}_1^{i-1})_k)$ is less than the reliability threshold value $T_{LLR}$, the decoder 130 determines that the reliability of the k-th decoding path is not relatively high, and thus separates the k-th decoding path from the decoding path list, and in addition, adds a decoding edge for the separated decoding path to the decoding path list. When a list decoding process is performed in this manner, the possibility of unnecessary separation of decoding paths from the decoding path list is reduced, and thus, decoding paths having a relatively high reliability may be efficiently configured.

As another example, when the decoder 130 decodes an information bit $(u_i)_k$ with respect to $i \in \mathcal{A}, u_{\mathcal{A}^c}$ by using the new list decoding method for a non-binary polar code, the decoder 130 adds a decoding edge corresponding to the information bit $(u_i)_k$ to the decoding path list if a reliability value $T((u_i)_k)$ of a decoding path, which is calculated by Equation 6, is equal to or less than the reliability threshold value $T_{LLR}$. If the reliability value $T((u_i)_k)$ of a decoding path, which is calculated by Equation 6, is greater than the reliability threshold value $T_{LLR}$, the decoding edge corresponding to the information bit $(u_i)_k$ is not considered. That is, in the case that the reliability value $T((u_i)_k)$ is greater than the reliability threshold value $T_{LLR}$, the decoding edge corresponding to the information bit $(u_i)_k$ is not added to the decoding path list.

Next, the decoder 130 determines whether the number L of decoding paths written in the decoding path list exceeds the number $L_{max}$ of critical paths (Operation S110-2).

If the number L of decoding paths written in the decoding path list exceeds the number $L_{max}$ of critical paths, the decoder 130 removes decoding paths from the decoding path list in an order of low likelihood possibility so that the number L of decoding paths is equal to the number $L_{max}$ of critical paths (Operation S110-3).

Figure 16:
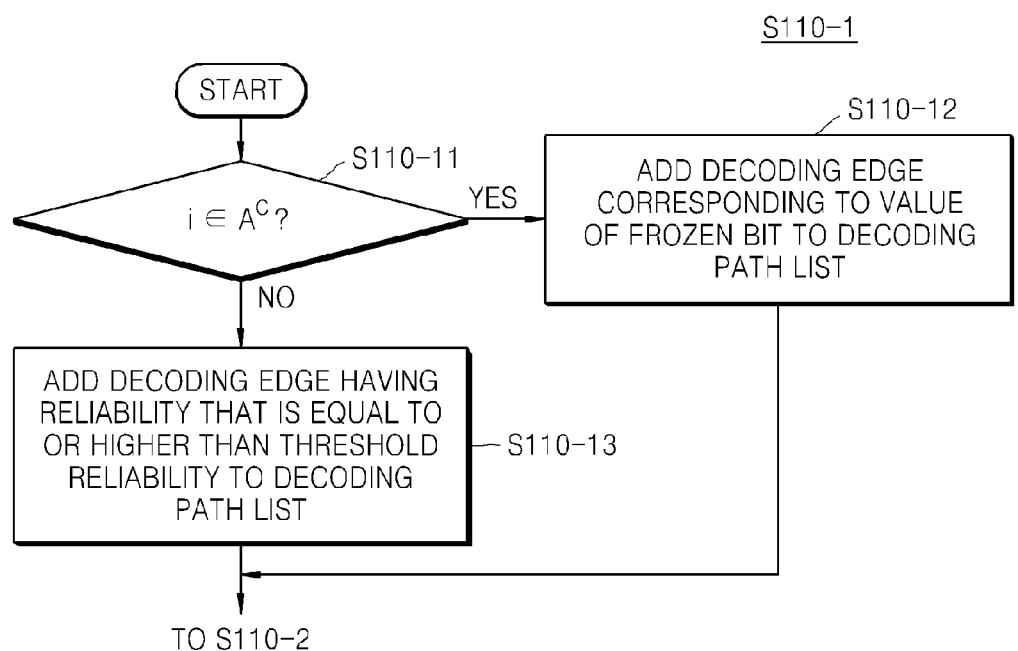
FIG. 16 is a flowchart of an operation of adding a decoding edge to a decoding path list, illustrated in FIG. 15, according to at least one example embodiment of the inventive concepts.

FIG. 16 is a flowchart of the operation (Operation S110-1) of adding a decoding edge to a decoding path list, illustrated in FIG. 15, according to at least one example embodiment of the inventive concepts.

The decoder 130 determines whether a decoding symbol is a frozen bit (Operation S110-11). That is, the decoder 130 determines whether the condition $i \in \mathcal{A}, u_{\mathcal{A}^c}{}^c$ is satisfied when decoding an i-th symbol. Here, "A" denotes an information set.

If the decoding symbol is a frozen bit, the decoder 130 adds a decoding edge corresponding to the value of the frozen bit to a decoding path list (Operation S110-12).

Otherwise, if the decoding symbol is not a frozen bit, the decoding symbol corresponds to an information bit as $i \in \mathcal{A}, u_{\mathcal{A}^c}$. In this case, the decoder 130 adds a decoding edge having a reliability that is equal to or higher than a threshold reliability to the decoding path list in the process of generating a tree-type decoding graph for input symbols (Operation S110-13). Since this operation has been described in detail above, repeated descriptions thereof are omitted.

Figure 17:
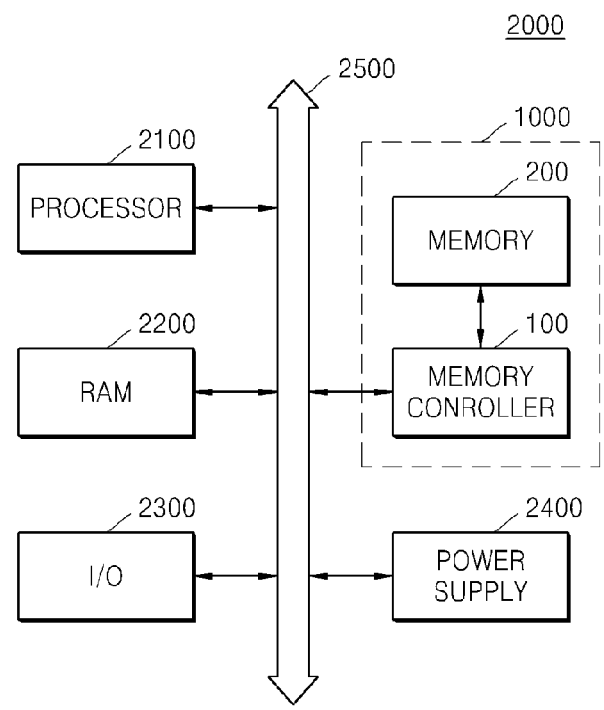
FIG. 17 is a block diagram of an electronic device including a memory system, according to at least one example embodiment of the inventive concepts.

FIG. 17 is a block diagram of an electronic device 2000 including a memory system 1000, according to at least one example embodiment of the inventive concepts.

Referring to FIG. 17, the electronic device 2000 may include a processor 2100, RAM 2200, an input/output (I/O) unit 2300, a power supply unit 2400, and the memory system 1000. Although not shown in FIG. 16, the electronic device 2000 may further include ports that may communicate with a video card, a sound card, a memory card, a universal serial bus (USB) device, or other electronic devices. The electronic device 2000 may be implemented, for example, by a personal computer (PC), or a portable electronic device, such as a notebook computer, a mobile phone, a personal digital assistant (PDA), or a camera.

The memory system 1000 illustrated in FIG. 17 may be the memory system 1000A illustrated in FIG. 1 or the memory system 1000B illustrated in FIG. 2. Accordingly, data read from the memory device 200 may be decoded by using the new list decoding method of a binary polar code or the new list decoding method of a non-binary polar code, described above with reference to one or more example embodiments of the inventive concepts.

The processor 2100 may perform specific calculations or tasks. According to an embodiment, the processor 2100 may be a microprocessor or a central processing unit (CPU). The processor 2100 may communicate with the RAM 2200, the I/O unit 2300, and the memory system 1000 via a bus 2500, such as an address bus, a control bus, or a data bus. According to an embodiment, the processor 2100 may also be connected to an extended bus, such as a peripheral component interconnect (PCI) bus.

The RAM 2200 may store data required to perform an operation of the electronic device 2000. For example, the RAM 2200 may be DRAM, mobile DRAM, SRAM, PRAM, FRAM, RRAM, and/or MRAM.

The I/O unit 2300 may include an input unit, such as a keyboard, a keypad, or mouse, and an output unit, such as a printer or a display. The power supply unit 2400 may supply an operating voltage required to perform the operation of the electronic device 2000.

Figure 18:
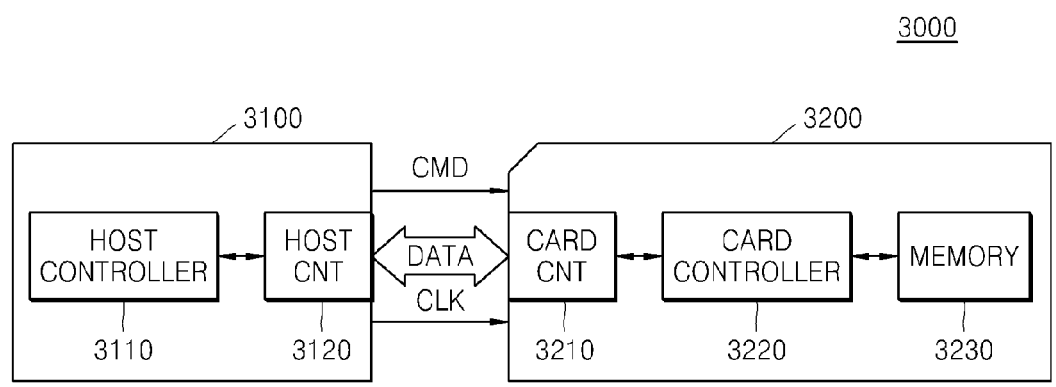
FIG. 18 is a block diagram of a memory card system including a memory system, according to at least one example embodiment of the inventive concepts.

FIG. 18 is a block diagram of a memory card system 30000 including a memory system, according to at least one example embodiment of the inventive concepts.

Referring to FIG. 18, the memory card system 3000 may include a host 3100 and a memory card 3200. The host 3100 may include a host controller 3110 and a host connector 3120. The memory card 3200 may include a card connector 3210, a card controller 3220, and a memory device 3230.

The card controller 3220 and the memory device 3230 illustrated in FIG. 18 may be the memory controller 100 and the memory device 200 or 200' illustrated in FIG. 1 or FIG. 2, respectively.

The host 3100 may write data into the memory card 3200, or may read data from the memory card 3200. The host controller 3110 may transmit a command CMD, a clock signal CLK that is generated by a clock generator (not shown) in the host 3100, and data DATA to the memory card 3200 via the host connector 3120.

In response to a command received via the card connector 3210, the card controller 3220 may decode data read from the memory device 3230 by using the new list decoding method of a binary polar code or the new list decoding method of a non-binary polar code, described above with reference to one or more example embodiments of the inventive concepts.

The memory card 3200 may be implemented with a compact flash card (CFC), a microdrive, a smart media card (SMC), a multimedia card (MMC), a security digital card (SDC), a memory stick, a USB flash memory driver, or the like.

Figure 19:
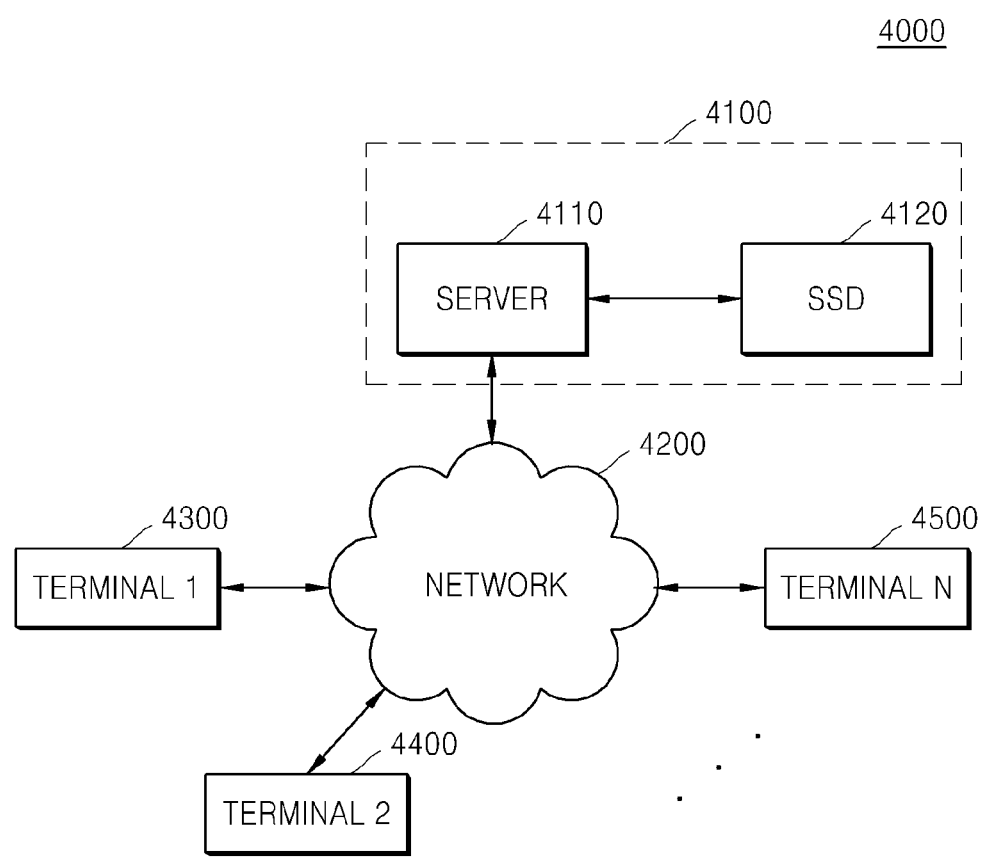
FIG. 19 is a block diagram of a network system including a server system, according to at least one example embodiment of the inventive concepts.

FIG. 19 is a block diagram of a network system 4000 including a server system 4100, according to at least one example embodiment of the inventive concepts.

Referring to FIG. 19, the network system 4000 may include the server system 4100 and a plurality of terminals 4300, 4400, and 4500 that are connected to one another via a network 4200. The server system 4100 may include a server 4110 that processes requests received from the plurality of terminals 4300, 4400, and 4500 connected to the network 4200, and an SSD 4120 that stores data corresponding to the requests received from the terminal 4300, 4400, and 4500. In this case, the SSD 4120 may be the memory system 1000A illustrated in FIG. 1 or the memory system 1000B illustrated in FIG. 2.

A memory system according to any of the above example embodiments of the inventive concepts may be embedded using various types of packages. For example, the memory system may be embedded using packages, such as package on package (POP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline integrated circuit (SOIC), shrink small outline package (SSOP), thin small outline (TSOP), system in package (SIP), multi chip package (MCP), wafer-level fabricated package (WFP), and wafer-level processed stack package (WSP).

Example embodiments of the inventive concepts having thus been described, it will be obvious that the same may be varied in many ways. Such variations are not to be regarded as a departure from the intended spirit and scope of example embodiments of the inventive concepts, and all such modifications as would be obvious to one skilled in the art are intended to be included within the scope of the following claims.

What is claimed is:

1. A list decoding method for a polar code, the method comprising:
   generating by decoder circuitry a tree-type decoding graph for input codeword symbols,
   the generating a tree-type decoding graph including,
      adding a plurality of decoding edges to a decoding path list based on reliabilities of the plurality of decoding paths of the decoding path list,
   the tree-type decoding graph being generated by the decoder circuitry such that, when a total number of decoding paths included in the decoding path list exceeds a threshold number,
      decoding paths, other than critical decoding paths, are removed from the decoding path list, such that the total number of decoding paths included in the decoding path list does not exceed the threshold number,
      the critical decoding paths being a first number of decoding paths having highest likelihood probabilities of decoding the input codeword symbols among the decoding paths of the decoding path list,
      the first number being the threshold number; and
   determining by the decoder circuitry, as an information word, an estimation value that corresponds to a decoding path having a maximum likelihood probability of decoding the input codeword symbols from among the decoding paths of the decoding path list.

2. The list decoding method of claim 1, further comprising:
   determining the reliabilities of the one or more decoding paths of the decoding path list based on log-likelihood ratios for the input codeword symbols.

3. The list decoding method of claim 2, wherein the determining the reliabilities includes determining, for each of the one or more decoding paths of the decoding path list, the reliability of the decoding path based on a log-likelihood ratio of a symbol corresponding to each of bit values estimated for a symbol having a maximum value of transition probabilities of a polarization channel, wherein the transition probabilities are calculated in the generating of the tree-type decoding graph.

4. The list decoding method of claim 1, wherein the input codeword symbols include symbols encoded with a non-binary polar code.

5. The list decoding method of claim 1, wherein the generating a tree-type decoding graph further includes,
   adding a decoding edge having a reliability that is equal to or higher than a threshold reliability to the decoding path list; and
   removing decoding paths from the decoding path list in an order of low likelihood possibility such that a total number of decoding paths in the decoding path list is equal to the threshold number if a total number of decoding paths generated based on the decoding edge exceeds the threshold number.

6. The list decoding method of claim 5, wherein the a tree-type decoding graph is generated such that a decoding edge having a reliability that is less than the threshold reliability is not added to the decoding path list in the generating of the tree-type decoding graph for codeword symbols.

7. The list decoding method of claim 1, wherein the generating a tree-type decoding graph includes,
   adding a decoding edge corresponding to a value of a frozen bit to the decoding path list, when a decoding symbol is the frozen bit;
   adding a decoding edge having a reliability that is equal to or higher than a threshold reliability to the decoding path list from among decoding edges corresponding to bit values that are capable of being estimated, when the decoding symbol is an information bit; and
   removing decoding paths from the decoding path list in an order of low likelihood possibility such that the total number of decoding paths included in the decoding path list is equal to the threshold number, when a number of decoding paths generated based on the decoding edge exceeds the threshold number.

8. The list decoding method of claim 7, wherein the generating a tree-type decoding graph includes generating the decoding path list such that a decoding edge having a low reliability that is less than the threshold reliability is not added to the decoding path list from among decoding edges corresponding to bit values that are capable of being estimated, when the decoding symbol is the information bit.

9. The list decoding method of claim 1, wherein the generating a tree-type decoding graph includes generating a decoding path list, and the generating a decoding path list comprises:
   initializing list size information;
   adding a decoding edge corresponding to a value of a frozen bit to the decoding path list without changing the list size information, when a decoding symbol is the frozen bit;
   estimating an information bit without changing the list size information and separating a first decoding path from a current decoding path when the decoding symbol is an information bit and the decoding path has a reliability that is equal to or higher than a threshold reliability;
   adding a decoding edge, which corresponds to each of bit values that are capable of being estimated to separate the first decoding path from the current decoding path, to the decoding path list and adding a number of separated decoding paths to the list size information, when the decoding symbol is the information bit and the decoding path has a reliability that is less than the threshold reliability; and
   removing decoding paths in an order of likelihood probability from among decoding paths included in the decoding path list, when the list size information exceeds the threshold number.

10. The list decoding method of claim 1, wherein the determining an estimation value comprises:
   selecting a decoding path having a highest likelihood probability from among decoding paths included in the decoding path list after completing the generating of the tree-type decoding graph for the input codeword symbols; and
   determining an estimation value corresponding to the selected decoding path as the information word.

11. A memory system comprising:
   a log likelihood ratio (LLR) calculator configured to calculate log-likelihood ratios from codeword symbols received from a memory device;
   a decoding path list generator for list decoding a polar code, the decoding path list generator configured to generate a tree-type decoding graph for the received codeword symbols by adding a plurality of decoding edges to a decoding path list, such that, when a total number of decoding paths included in the decoding path list exceeds a threshold number,
   decoding paths, other than critical decoding paths, are removed from the decoding path list, such that the total number of decoding paths included in the decoding path list does not exceed the threshold number,
   the critical decoding paths being a first number of decoding paths having highest likelihood probabilities of decoding the received codeword symbols among the decoding paths included in the decoding path list,
   the first number being the threshold number; and a decoding path determination unit configured to, calculate likelihood probabilities of decoding paths included in the decoding path list, and
   output, as an information word, an estimation value that corresponds to a decoding path having a maximum likelihood probability of decoding the received codeword symbols from among the calculated likelihood probabilities.

12. The memory system of claim 11, wherein the decoding path list generator is configured to determine reliabilities of decoding paths based on a log-likelihood ratio of a symbol corresponding to each of bit values that can be estimated for a symbol having a maximum value of transition probabilities of a polarization channel, which are calculated in the generating of the tree-type decoding graph.

13. The memory system of claim 11, wherein the decoding path list generator is configured to,
   add a decoding edge having a reliability that is equal to or higher than a threshold reliability to the decoding path list in the generating of the tree-type decoding graph for codeword symbols based on the calculated log-likelihood ratios, and
   remove, from the decoding path list, a first number of decoding paths having lowest likelihood possibilities among the decoding paths of the decoding path list, such that a total number of decoding paths of the decoding path list does not exceed the threshold number.

14. The memory system of claim 11, further comprising an encoder comprising:
   an input vector generator configured to combine an input information word with a frozen bit to thereby generate an input symbol vector; and
   a code vector generator configured to generate codeword symbols by using the input symbol vector and a generation matrix, wherein the generated codeword symbols are stored in the memory device.

15. The memory system of claim 14, wherein the code vector generator is configured to generate non-binary codeword symbols.

16. A list decoding method for a polar code, the method comprising:
   generating by decoder circuitry a tree-type decoding graph for an input codeword by generating a plurality of decoding paths;
   adding by the decoder circuitry a plurality of decoding paths from among the generated plurality of decoding paths to a decoding path list based on reliabilities of the generated plurality of decoding paths, the decoding path list having a list size threshold; and
   when a size of the decoding path list exceeds the list size threshold,
      reducing by the decoder circuitry the size of the decoding path list to the list size threshold by removing a first reliability path set from the decoding path list, the first reliability path set being one or more decoding paths, from among the of decoding-paths included in the decoding path list, having lowest reliabilities with respect to the decoding paths included in the decoding path list; and
      determining by the decoder circuitry, as an information word, an estimation value based a selected decoding path, the selected decoding path being one of one or more decoding paths remaining in the decoding path list after the reducing.

17. The list decoding method of claim 16, wherein the determining includes determining the estimation value based on the decoding path having a highest likelihood probability from among the one or more decoding paths remaining in the decoding path list after the reducing.

* * * * *